(12) United States Patent
G et al.

(10) Patent No.: US 12,348,132 B2
(45) Date of Patent: Jul. 1, 2025

(54) STAGE BASED FREQUENCY OPTIMIZATION FOR AREA REDUCTION OF CHARGE PUMPS

(71) Applicant: SanDisk Technologies LLC, Addison, TX (US)

(72) Inventors: V. S. N. K. Chaitanya G, Bengaluru (IN); Ankit Rehani, Burari (IN); Pradeep Kumar Anantula, Bengaluru (IN)

(73) Assignee: Sandisk Technologies, Inc., Milpitas, CA (US)

( * ) Notice: Subject to any disclaimer, the term of this patent is extended or adjusted under 35 U.S.C. 154(b) by 184 days.

(21) Appl. No.: 18/346,335

(22) Filed: Jul. 3, 2023

(65) Prior Publication Data

US 2024/0283359 A1 Aug. 22, 2024

Related U.S. Application Data

(60) Provisional application No. 63/485,304, filed on Feb. 16, 2023.

(51) Int. Cl.
| | |
|---|---|
| *G11C 7/00* | (2006.01) |
| *G11C 16/30* | (2006.01) |
| *H02M 3/07* | (2006.01) |
| *G11C 16/04* | (2006.01) |
| *H01L 25/065* | (2023.01) |

(52) U.S. Cl.
CPC ............. *H02M 3/07* (2013.01); *G11C 16/30* (2013.01); *G11C 16/0483* (2013.01); *H01L 25/0657* (2013.01); *H01L 2225/06562* (2013.01)

(58) Field of Classification Search
CPC .... G11C 8/08; G11C 5/45; G11C 7/12; G11C 11/4085; G11C 5/147
USPC .................................................... 365/189.11
See application file for complete search history.

(56) References Cited

U.S. PATENT DOCUMENTS

| | | | |
|---|---|---|---|
| 7,030,683 | B2 | 4/2006 | Pan et al. |
| 7,554,311 | B2 | 6/2009 | Pan |
| 7,586,362 | B2 | 9/2009 | Pan et al. |
| 7,969,235 | B2 | 6/2011 | Pan |
| 8,040,174 | B2 | 10/2011 | Likhterov |
| 8,294,509 | B2 | 10/2012 | Pan et al. |
| 8,421,524 | B2 | 4/2013 | Pan et al. |

(Continued)

OTHER PUBLICATIONS

Kim, Sang-Won, et al., "A High Efficiency Variable Stage and Frequency Charge Pump for Wide Range ISPP," IEEE International Symposium on Circuits and Systems (ISCAS), Sep. 2020, 5 pages.

(Continued)

*Primary Examiner* — Son T Dinh
(74) *Attorney, Agent, or Firm* — Pearl Cohen Zedek Latzer Baratz LLP

(57) ABSTRACT

A stage-based frequency optimization for a charge pump achieves a higher area efficiency by operating different stages of the charge pump at their optimized frequency simultaneously, instead of single common frequency, to obtain greater output strength. A first set of stages uses triple well devices as transfer switches and operates at a first, higher frequency. The first stages supply a second set of stages using high voltage devices as transfer switches and operates at a second, lower frequency. The two set of stages are connected through a frequency transition circuit.

20 Claims, 29 Drawing Sheets

(56) References Cited

U.S. PATENT DOCUMENTS

| | | | |
|---|---|---|---|
| 8,699,247 | B2 | 4/2014 | Nguyen et al. |
| 8,710,907 | B2 | 4/2014 | Nguyen et al. |
| 8,710,909 | B2 | 4/2014 | Kalluru et al. |
| 9,164,526 | B2 | 10/2015 | Pan et al. |
| 9,553,506 | B1 | 1/2017 | Huynh et al. |
| 9,653,126 | B2 | 5/2017 | Nguyen et al. |
| 10,033,271 | B1 | 7/2018 | Shay et al. |
| 10,951,114 | B2 | 3/2021 | Pan et al. |
| 10,998,816 | B1 | 5/2021 | Payak |
| 11,073,570 | B1 | 7/2021 | Li et al. |
| 11,545,984 | B2 | 1/2023 | Sokolov et al. |
| 2007/0126494 | A1 | 6/2007 | Pan |
| 2008/0068068 | A1 | 3/2008 | Yadala |
| 2009/0302930 | A1 | 12/2009 | Pan et al. |
| 2011/0018615 | A1 | 1/2011 | Pan |
| 2011/0148509 | A1 | 6/2011 | Pan |
| 2012/0049936 | A1* | 3/2012 | Adkins ............... H02M 3/07 327/536 |
| 2016/0380532 | A1 | 12/2016 | Reddy et al. |

OTHER PUBLICATIONS

Abaravicius, Bartas, et al., "High-Efficiency High Voltage Hybrid Charge Pump Design With an Improved Chip Area," IEEE Access, Jul. 2021, 12 pages.

Mahmoud, Abdulqader, et al., "A Charge Pump Based Power Management Unit With 66%-Efficiency in 65 nm CMOS," IEEE International Symposium on Circuits and Systems (ISCAS), May 2018, 4 pages.

U.S. Appl. No. 17/741,805, filed May 11, 2022.

* cited by examiner

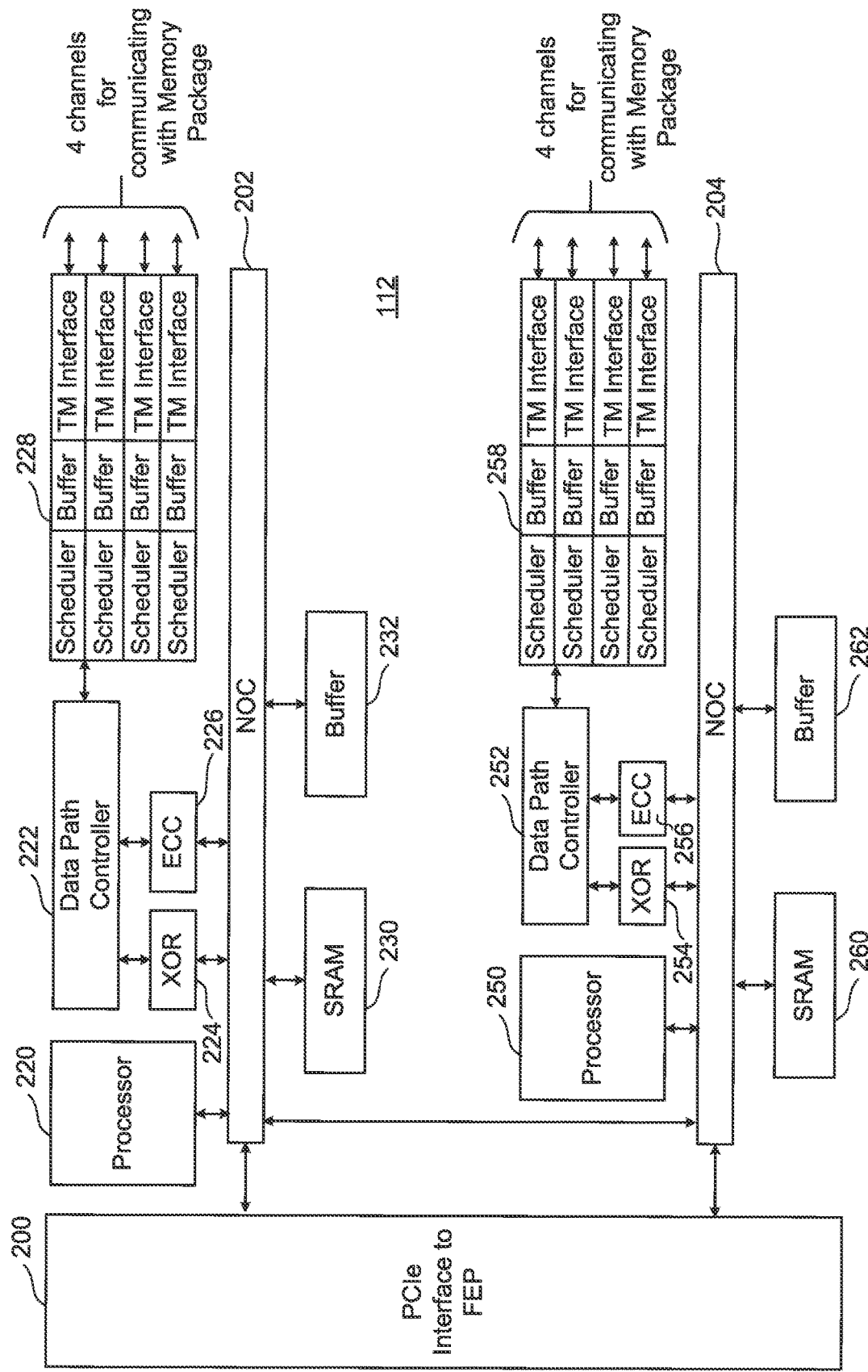

Figure 7A
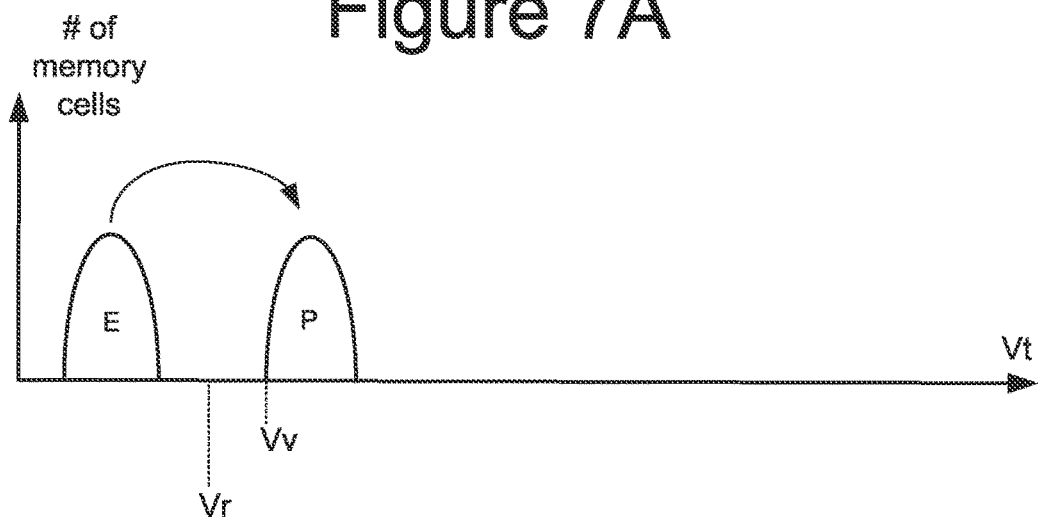
Figure 7B
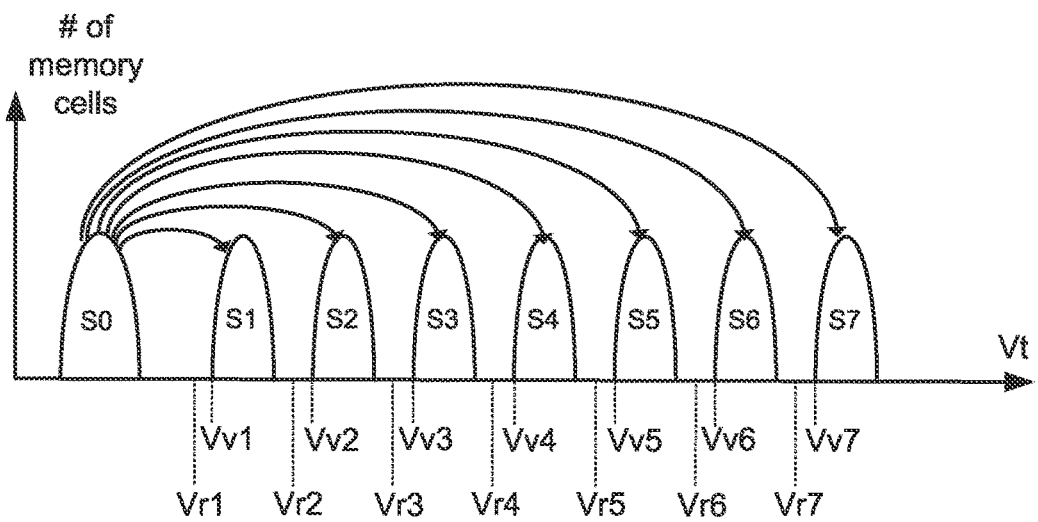
Figure 7C
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

STAGE BASED FREQUENCY OPTIMIZATION FOR AREA REDUCTION OF CHARGE PUMPS

CLAIM OF PRIORITY

The present application claims priority from U.S. Provisional Patent Application No. 63/485,304, entitled "STAGE BASED FREQUENCY OPTIMIZATION FOR AREA REDUCTION OF CHARGE PUMPS," by Chaitanya G et al., filed Feb. 16, 2023, incorporated by reference herein in its entirety.

BACKGROUND

The present disclosure relates to technology for non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). An example of non-volatile memory is flash memory (e.g., NAND-type and NOR-type flash memory). Users of non-volatile memory typically want the memory to operate at high speeds so that they do not need to wait for memory operations to be completed, but also want the memory to consume less power.

BRIEF DESCRIPTION OF THE DRAWINGS

Like-numbered elements refer to common components in the different figures.

FIG. 2A is a block diagram of one embodiment of a Back End Processor Circuit.

FIG. 7A depicts threshold voltage distributions of memory cells in a binary embodiment.

FIG. 7B depicts threshold voltage distributions of memory cells in a multi-level cell (MLC) embodiment.

FIG. 7C is a table describing one example of an assignment of data values to data states.

DETAILED DESCRIPTION

Charge pumps are important building blocks for NAND Flash memory and other non-volatile memory devices. They are commonly used for providing appropriate bias voltage levels for the arrays of memory cells to perform erase, program, and read operations that use voltage levels higher than the memory device's supply level. These analog circuits convert a fixed input voltage to a higher output voltage as needed for the memory device's biasing requirements. Charge pumps can occupy significant chip area on a memory die. Also, this area is expected to grow in each generation of memory device due to the increase in the number of memory cells on a device, which leads to increased loading of some of the charge pumps. With decreasing die-size and increased loading, the area of charge pump needs to be efficiently minimized as much as possible. The following presents a stage-based frequency optimization for achieving higher area efficiency. In other words, different stages of the charge pump can be operated at their best possible frequency simultaneously, instead of single common frequency, to obtain greater output strength.

FIGS. 1A-6F describe one example of a storage system that can be used to implement the technology disclosed herein.

Figure 1A:
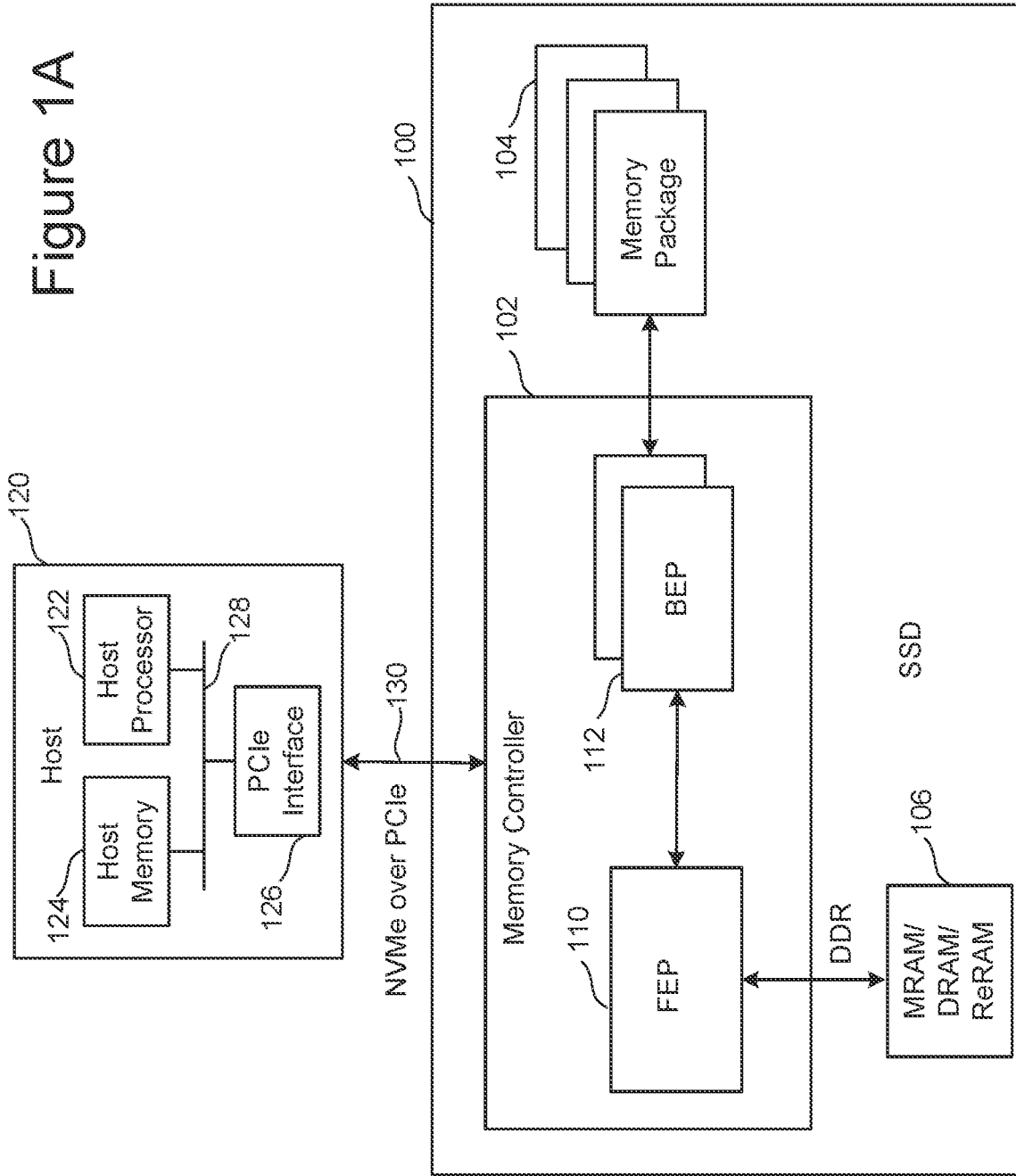
FIG. 1A is a block diagram of one embodiment of a storage system connected to a host.

FIG. 1A is a block diagram of one embodiment of a storage system 100 connected to a host system 120. Storage system 100 can implement the technology disclosed herein. Many different types of storage systems can be used with the technology disclosed herein. One example storage system is a solid state drive ("SSD"); however, other types of storage systems can also be used. Storage system 100 comprises a memory controller 102, memory package 104 for storing data, and local memory (e.g., MRAM/DRAM/to turn off M) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two dimensional NAND flash memory and/or three dimensional NAND flash memory). In other embodiments, the memory package 104 can include other types of memory; for example, the memory package can include Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory or another type of storage. Host system 120 is external to and separate from storage system 100. In one embodiment, storage system 100 is embedded in host system 120. In other embodiments, the controller 102 may communicate with host 120 via other types of communication buses and/or links, including for example, over an NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like. For simplicity, the example embodiments below will be described with respect to a PCIe example.

Figure 1B:
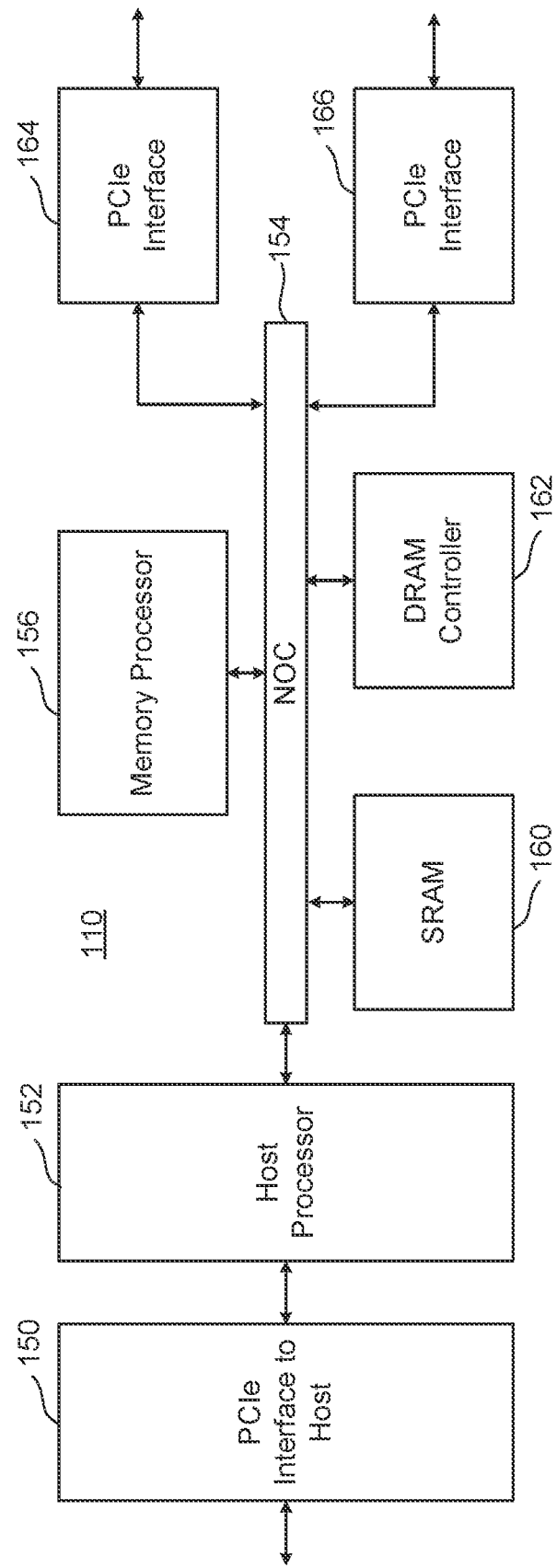
FIG. 1B is a block diagram of one embodiment of a Front End Processor Circuit.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the local memory 106 (e.g., DRAM/MRAM/ReRAM). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 are able to recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
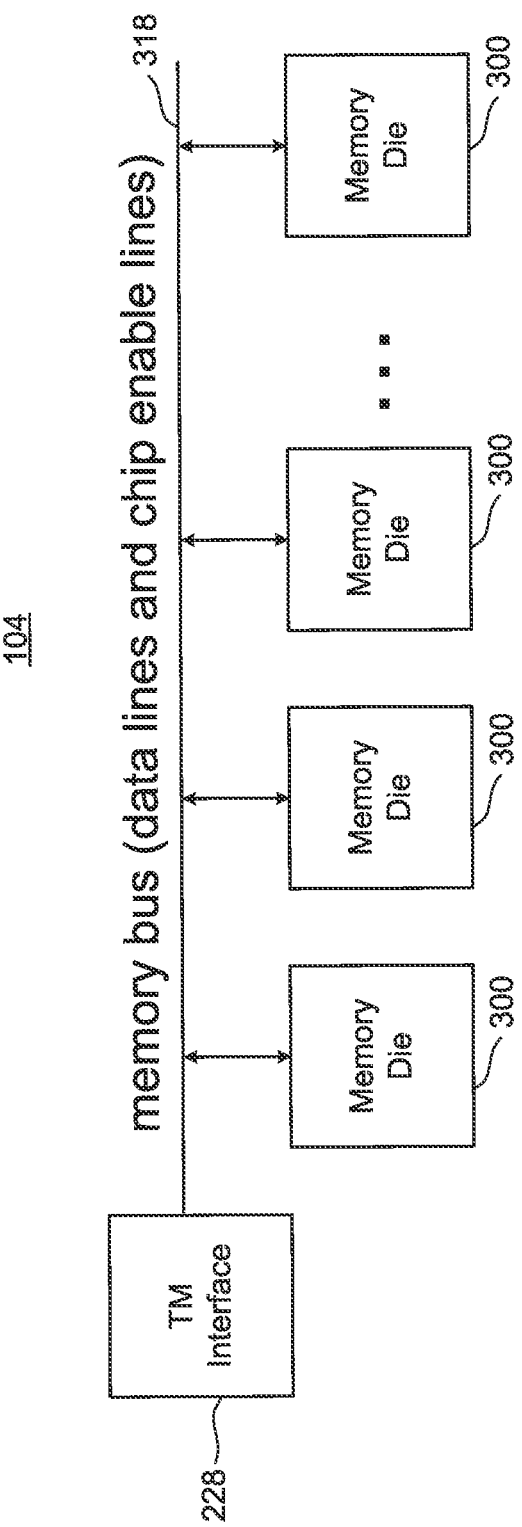
FIG. 2B is a block diagram of one embodiment of a memory package.

FIG. 2B is a block diagram of one embodiment of a memory package 104 that includes a plurality of memory dies 300 connected to a memory bus (data lines and chip enable lines) 318. The memory bus 318 connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or sixteen memory die; however, other numbers of memory die can also be implemented. The technology described herein is not limited to any particular number of memory die. In some embodiments, the memory package can also include a processor, CPU device, such as a RISC-V CPU along with some amount of RAM to help implement some of capabilities described below. The technology described herein is not limited to any particular number of memory die.

Figure 3A:
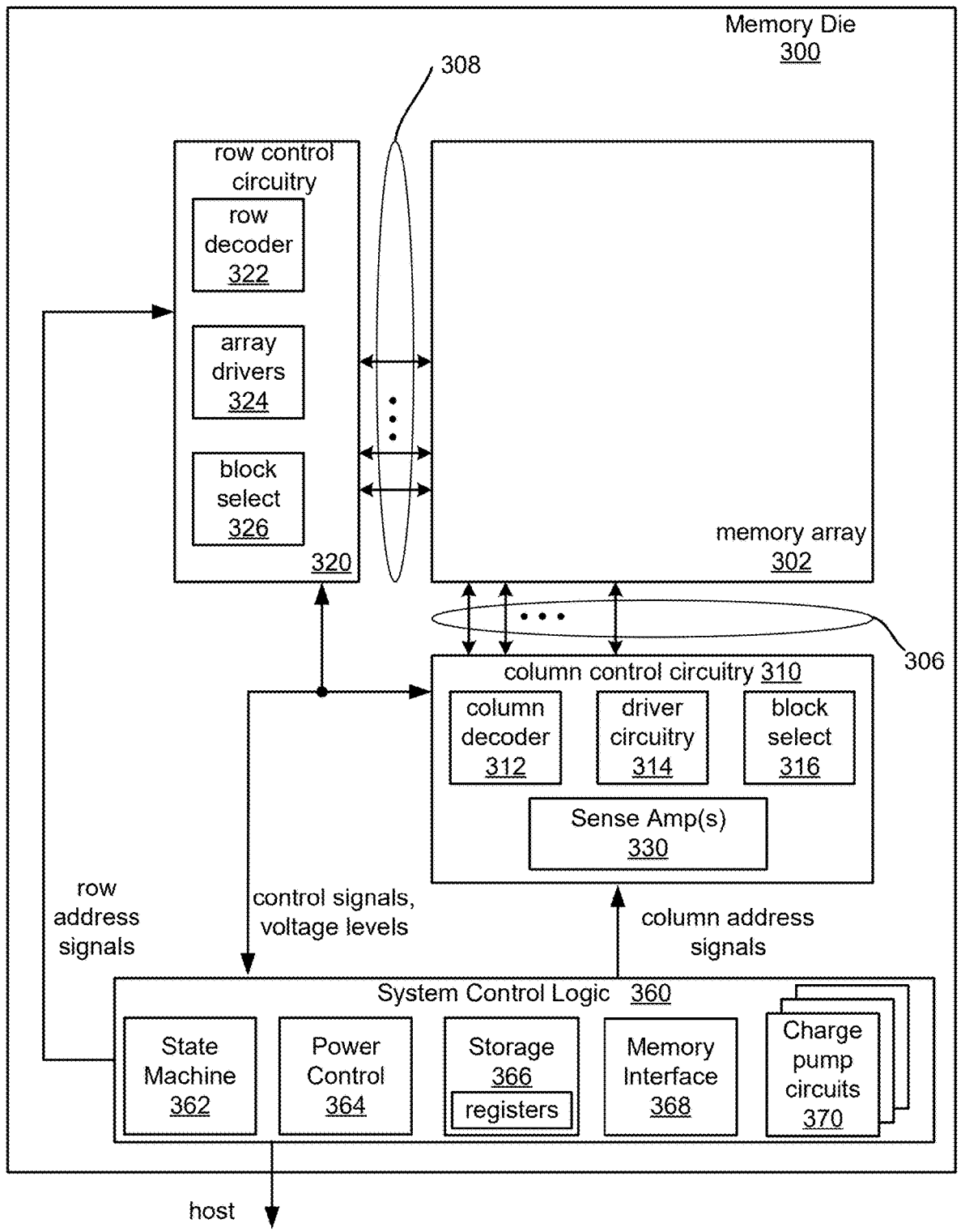
FIG. 3A is a functional block diagram of an embodiment of a memory die.

FIG. 3A is a block diagram that depicts one example of a memory die 300 that can implement the technology described herein. Memory die 300, which can correspond to one of the memory die 300 of FIG. 2B, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs 308 are connected to respective word lines of the memory array 302. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs 306 are connected to respective bit lines of the memory array 302. Although only single block is shown for array 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

System control logic 360 receives data and commands from a host and provides output data and status to the host. In other embodiments, system control logic 360 receives data and commands from a separate controller circuit and provides output data to that controller circuit, with the controller circuit communicating with the host. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 controls the power and voltages supplied to the rows and columns of the memory 302 during memory operations and may include charge pumps and regulator circuit for creating regulating voltages. System control logic 360 includes storage 366, which may be used to store parameters for operating the memory array 302.

Commands and data are transferred between the controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the controller 102.

Non-volatile memory operations often require a number of voltage levels that are higher than the supply level received by the memory device. To generate these additional operating voltages, the control circuits of the memory device can include one or more charge pump circuits 370.

In some embodiments, all of the elements of memory die 300, including the system control logic 360, can be formed as part of a single die. In other embodiments, some or all of the system control logic 360 can be formed on a different die.

For purposes of this document, the phrase "one or more control circuits" can include a controller, a state machine, a micro-controller, micro-processor, and/or other control circuitry as represented by the system control logic 360, or other analogous circuits that are used to control non-volatile memory.

In one embodiment, memory structure 302 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts, the structure of memory structure 302 of the memory cells and the peripheral circuitry, including all of the other elements. An important characteristic of a memory circuit is its capacity, which can be increased by increasing the area of the memory die of memory system 100 that is given over to the memory structure 302; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the memory system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 3B:
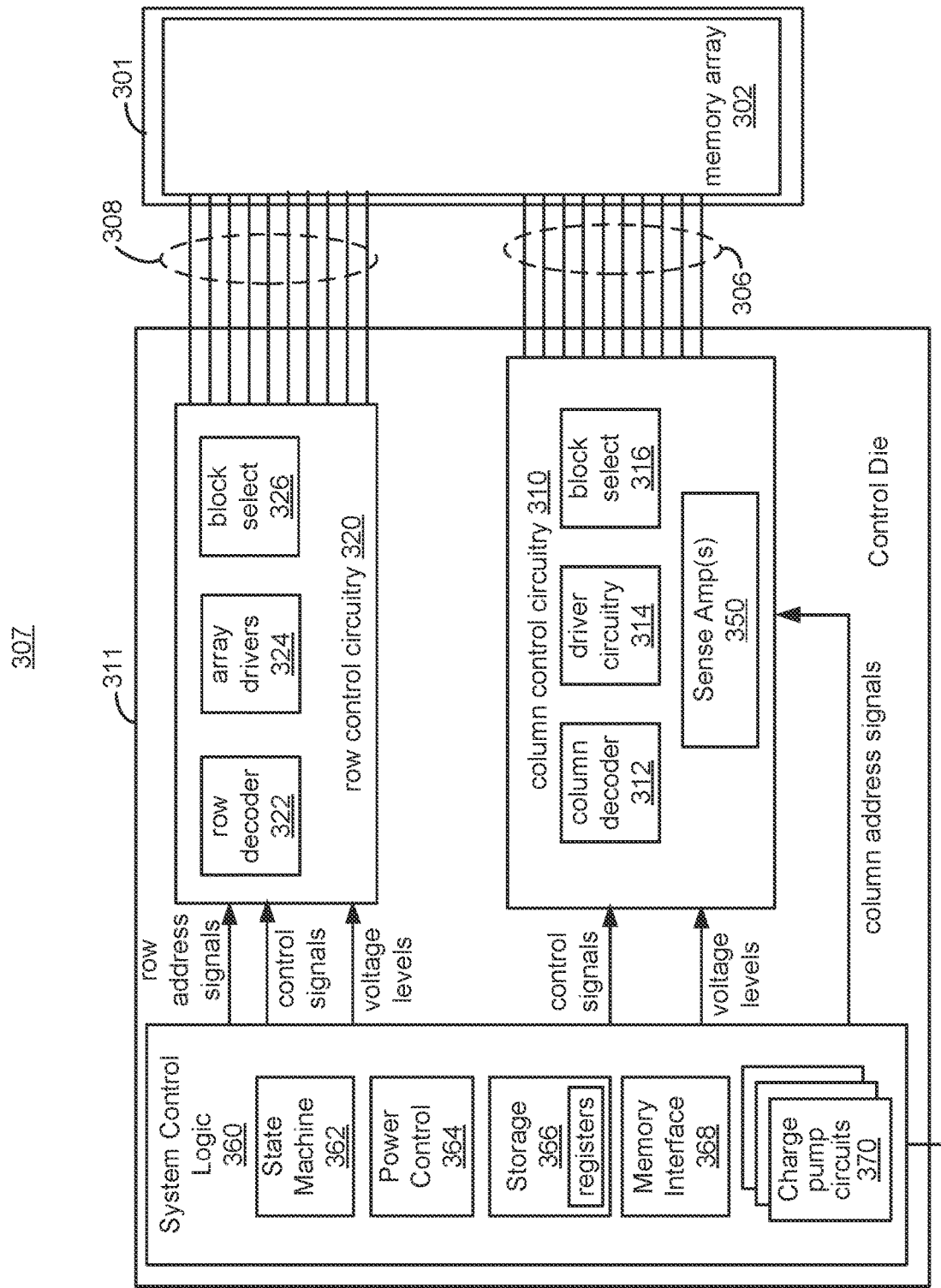
FIG. 3B is a functional block diagram of an embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. The integrated memory assembly 307 may be used in a memory package 104 in storage system 100. The integrated memory assembly 307 includes two types of semiconductor die (or more succinctly, "die"). Memory structure die 301 includes memory structure 302. Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. It can be seen that system control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 3B shows column control circuitry 310 including sense amplifier(s) 350 on the control die 311 coupled to memory structure 302 on the memory structure die 301 through electrical paths 306. For example, electrical paths 306 may provide electrical connection between column decoder 312, driver circuitry 314, and block select 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory structure 302 through electrical paths 308. Each of electrical path 308 may correspond to a word line, dummy word line, or select gate line. Additional electrical paths may also be provided between control die 311 and memory structure die 301.

For purposes of this document, the phrase "one or more control circuits" can include one or more of controller 102, system control logic 360, column control circuitry 310, row control circuitry 320, a micro-controller, a state machine, and/or other control circuitry, or other analogous circuits that are used to control non-volatile memory. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 4:
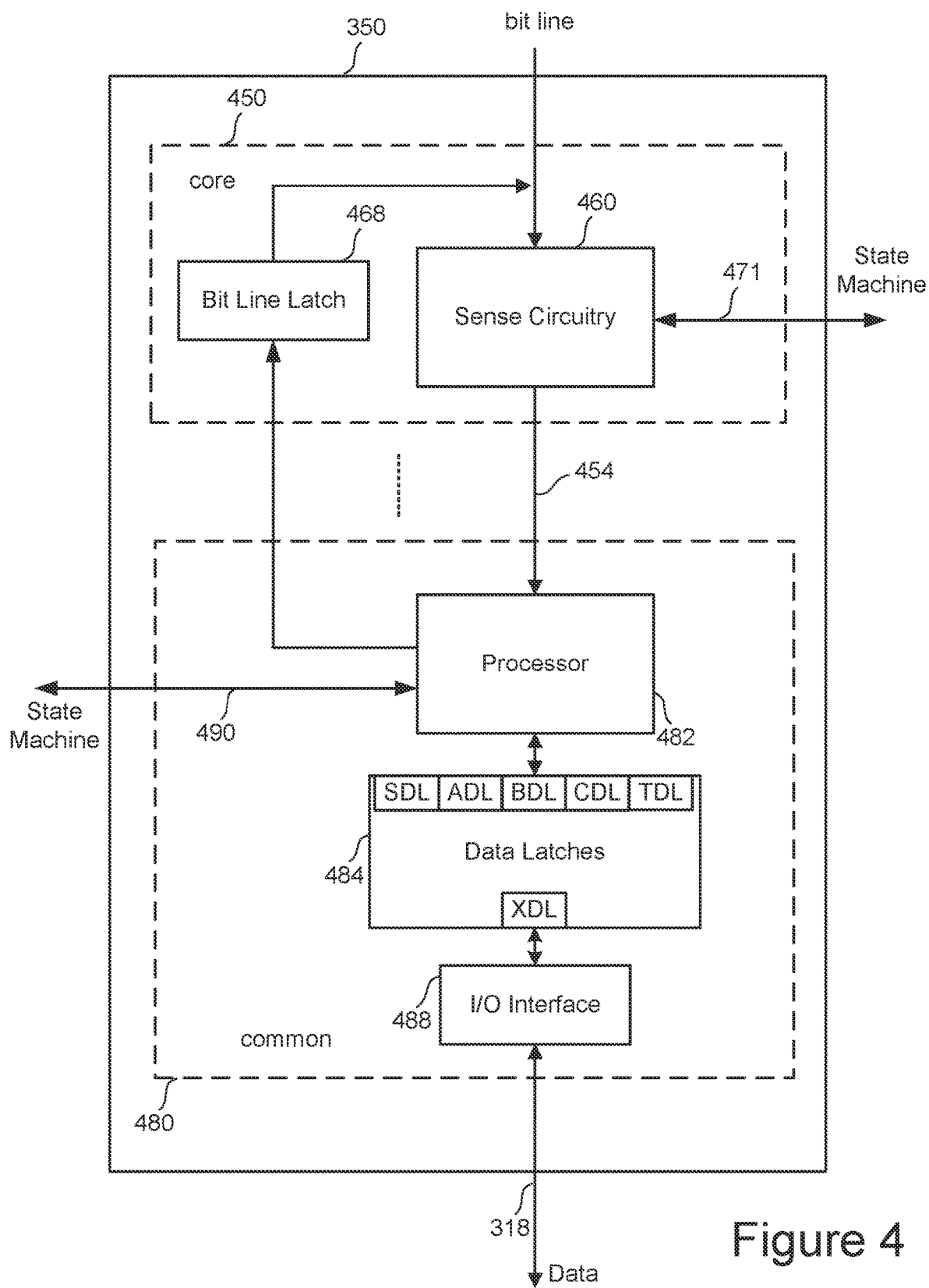
FIG. 4 is a block diagram of an individual sense block partitioned into a core portion and a common portion.

FIG. 4 is a block diagram of an individual sense block of sense amplifiers 350 partitioned into a core portion, referred to as a sense module 480, and a common portion 480. In one embodiment, there will be a separate sense module 450 for each bit line and one common portion 480 for a set of multiple sense modules 450. In one example, a sense block will include one common portion 480 and eight sense, twelve, or sixteen modules 450. Each of the sense modules in a group will communicate with the associated common portion via a data bus 454.

Sense module 450 comprises sense circuitry 460 that determines whether a conduction current in a connected bit line is above or below a predetermined level or, in voltage based sensing, whether a voltage level in a connected bit line is above or below a predetermined level. The sense circuitry 460 is to received control signals from the state machine via input lines 471. In some embodiments, sense module 450 includes a circuit commonly referred to as a sense amplifier. Sense module 450 also includes a bit line latch 468 that is used to set a voltage condition on the connected bit line. For example, a predetermined state latched in bit line latch 468 will result in the connected bit line being pulled to a state designating program inhibit (e.g., Vdd).

Common portion 480 comprises a processor 468, a set of data latches 484 and an I/O Interface 488 coupled between the set of data latches 484 and data bus 318. Processor 468 performs computations. For example, one of its functions is to determine the data stored in the sensed memory cell and store the determined data in the set of data latches. The set of data latches 484 is used to store data bits determined by processor 468 during a read operation. It is also used to store data bits imported from the data bus 318 during a program operation. The imported data bits represent write data meant to be programmed into the memory. I/O interface 488 provides an interface between data latches 484 and the data bus 318.

During read or sensing, the operation of the system is under the control of state machine 362 that controls (using power control 364) the supply of different control gate or other bias voltages to the addressed memory cell(s). As it steps through the various predefined control gate voltages corresponding to the various memory states supported by the memory, the sense module 450 may trip at one of these voltages and an output will be provided from sense module 450 to processor 482 via bus 454. At that point, processor 482 determines the resultant memory state by consideration of the tripping event(s) of the sense module and the information about the applied control gate voltage from the state machine via input lines 490. It then computes a binary encoding for the memory state and stores the resultant data bits into data latches 484. In another embodiment of the core portion, bit line latch 468 serves double duty, both as a latch for latching the output of the sense module 450 and also as a bit line latch as described above.

Data latch stack 484 contains a stack of data latches corresponding to the sense module. In one embodiment, there are three, four or another number of data latches per sense module 450. In one embodiment, the latches are each one bit. In this document, the latches in one embodiment of data latch stack 484 will be referred to as SDL, XDL, ADL, BDL, and CDL. In the embodiments discussed here, the latch XDL is a transfer latch used to exchange data with the I/O interface 488. In addition to a first sense amp data latch SDL, the additional latches ADL, BDL and CDL can be used to hold multi-state data, where the number of such latches typically reflects the number of bits stored in a memory cell. For example, in 3-bit per cell multi-level cell (MLC) memory format, the three sets of latches ADL, BDL, CDL can be used for upper, middle, lower page data. In 2-bit per cell embodiment, only ADL and BDL might be used, while a 4-bit per cell MLC embodiment might include a further set of DDL latches. In other embodiments, the XDL latches can be used to hold additional pages of data, such as a 4-bit per cell MLC embodiment the uses the XDL latches in addition to the three sets of latches ADL, BDL, CDL for four pages of data. The following discussion will mainly focus on a 3-bit per cell embodiment, as this can illustrate the main features but not get overly complicated, but the discussion can also be applied to embodiments with more or fewer bit per cell formats. Some embodiments many also include additional latches for particular functions, such as represented by the TDL latch where, for example, this could be used in "quick pass write" operations where it is used in program operations for when a memory cell is approaching its target state and is partially inhibited to slow its programming rate.

For example, in some embodiments data read from a memory cell or data to be programmed into a memory cell will first be stored in XDL. In case the data is to be programmed into a memory cell, the system can program the data into the memory cell from XDL. In one embodiment, the data is programmed into the memory cell entirely from XDL before the next operation proceeds. In other embodiments, as the system begins to program a memory cell through XDL, the system also transfers the data stored in XDL into ADL in order to reset XDL. Before data is transferred from XDL into ADL, the data kept in ADL is transferred to BDL, flushing out whatever data (if any) is being kept in BDL, and similarly for BDL and CDL. Once data has been transferred from XDL into ADL, the system continues (if necessary) to program the memory cell through ADL, while simultaneously loading the data to be programmed into a memory cell on the next word line into XDL, which has been reset. By performing the data load and programming operations simultaneously, the system can save time and thus perform a sequence of such operations faster.

During program or verify, the data to be programmed is stored in the set of data latches 484 from the data bus 318. During the verify process, processor 482 monitors the verified memory state relative to the desired memory state. When the two are in agreement, processor 482 sets the bit line latch 468 so as to cause the bit line to be pulled to a state designating program inhibit. This inhibits the memory cell coupled to the bit line from further programming even if it is subjected to programming pulses on its control gate. In other embodiments the processor initially loads the bit line latch 468 and the sense circuitry sets it to an inhibit value during the verify process.

In some implementations (but not required), the data latches are implemented as a shift register so that the parallel data stored therein is converted to serial data for data bus 318, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 5A:
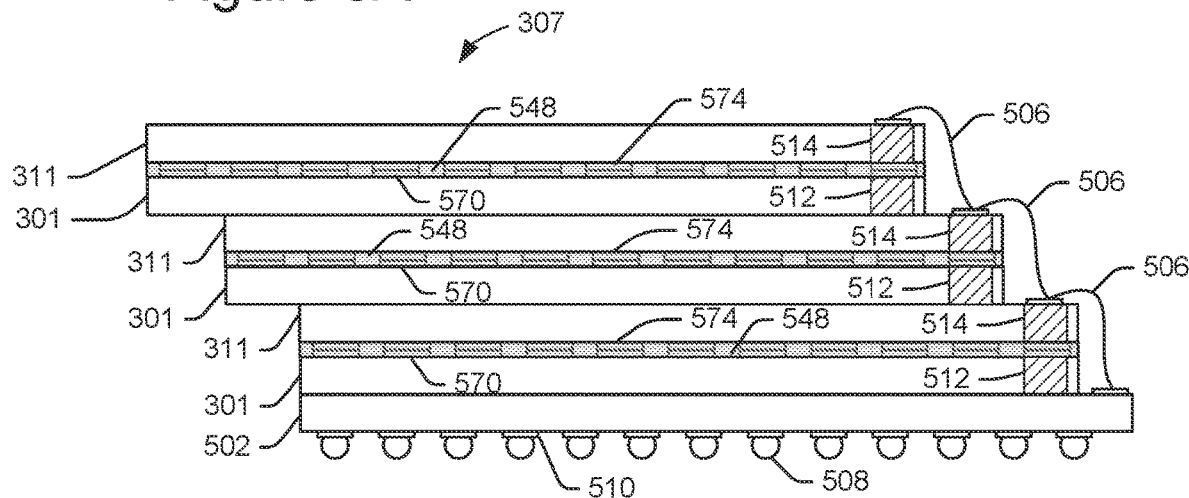
FIG. 5A depicts a side view of an embodiment of an integrated memory assembly stacked on a substrate.

In some embodiments, there is more than one control die 311 and more than one memory structure die 301 in an integrated memory assembly 307. In some embodiments, the integrated memory assembly 307 includes a stack of multiple control die 311 and multiple memory structure die 301. FIG. 5A depicts a side view of an embodiment of an integrated memory assembly 307 stacked on a substrate 502 (e.g., a stack comprising control dies 311 and memory structure dies 301). The integrated memory assembly 307 has three control dies 311 and three memory structure dies 301. In some embodiments, there are more than three memory structure dies 301 and more than three control die 311.

Each control die 311 is affixed (e.g., bonded) to at least one of the memory structure dies 301. Some of the bond pads 570, 574, are depicted. There may be many more bond pads. A space between two dies 301, 311 that are bonded together is filled with a solid layer 548, which may be formed from epoxy or other resin or polymer. This solid layer 548 protects the electrical connections between the dies 301, 311, and further secures the dies together. Various materials may be used as solid layer 548, but in embodiments, it may be Hysol epoxy resin from Henkel Corp., having offices in California, USA.

The integrated memory assembly 307 may for example be stacked with a stepped offset, leaving the bond pads at each level uncovered and accessible from above. Wire bonds 506 connected to the bond pads connect the control die 311 to the substrate 502. A number of such wire bonds may be formed across the width of each control die 311 (i.e., into the page of FIG. 5A).

A memory structure die through silicon via (TSV) 512 may be used to route signals through a memory structure die 301. A control die through silicon via (TSV) 514 may be used to route signals through a control die 311. The TSVs 512, 514 may be formed before, during or after formation of the integrated circuits in the semiconductor dies 301, 311. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 508 may optionally be affixed to contact pads 510 on a lower surface of substrate 502. The solder balls 508 may be used to electrically and mechanically couple the integrated memory assembly 307 to a host device such as a printed circuit board. Solder balls 508 may be omitted where the integrated memory assembly 307 is to be used as an LGA package. The solder balls 508 may form a part of the interface between the integrated memory assembly 307 and the memory controller 102.

Figure 5B:
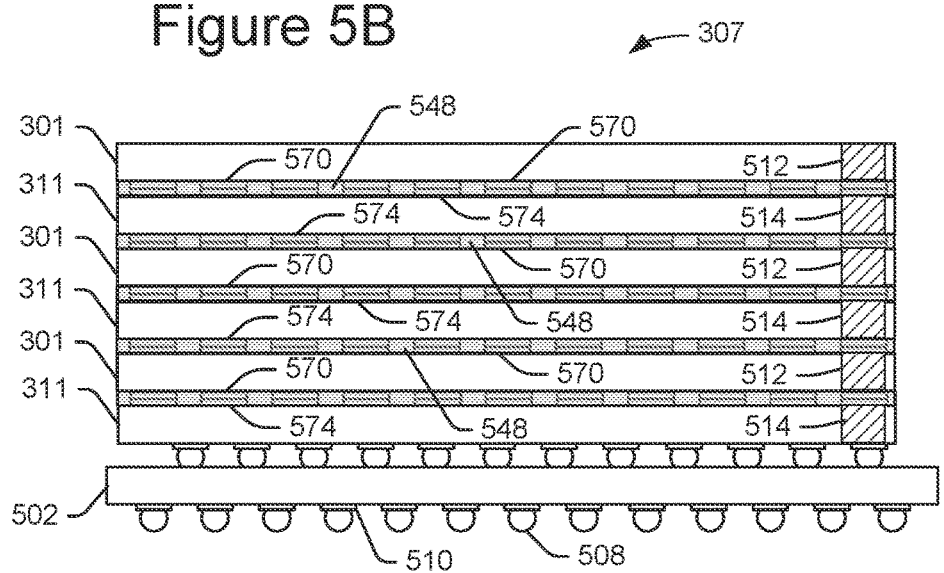
FIG. 5B depicts a side view of an embodiment of an integrated memory assembly stacked on a substrate.

FIG. 5B depicts a side view of an embodiment of an integrated memory assembly 307 stacked on a substrate 502. The integrated memory assembly 307 has three control die 311 and three memory structure die 301. In some embodiments, there are many more than three memory structure dies 301 and many more than three control dies 311. In this example, each control die 311 is bonded to at least one memory structure die 301. Optionally, a control die 311 may be bonded to two memory structure die 301.

Some of the bond pads 570, 574 are depicted. There may be many more bond pads. A space between two dies 301, 311 that are bonded together is filled with a solid layer 548, which may be formed from epoxy or other resin or polymer. In contrast to the example in FIG. 5A, the integrated memory assembly 307 in FIG. 5B does not have a stepped offset. A memory structure die through silicon via (TSV) 512 may be used to route signals through a memory structure die 301. A control die through silicon via (TSV) 514 may be used to route signals through a control die 311.

As has been briefly discussed above, the control die 311 and the memory structure die 301 may be bonded together. Bond pads on each die 301, 311 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 301, 311. Where no such film is initially provided, a space between the dies may be under filled with an epoxy or other resin or polymer. The under-fill material may be applied as a liquid which then hardens into a solid layer. This under-fill step protects the electrical connections between the dies 301, 311, and further secures the dies together. Various materials may be used as under-fill material, but in embodiments, it may be Hysol epoxy resin from Henkel Corp., having offices in California, USA.

Figure 6A:
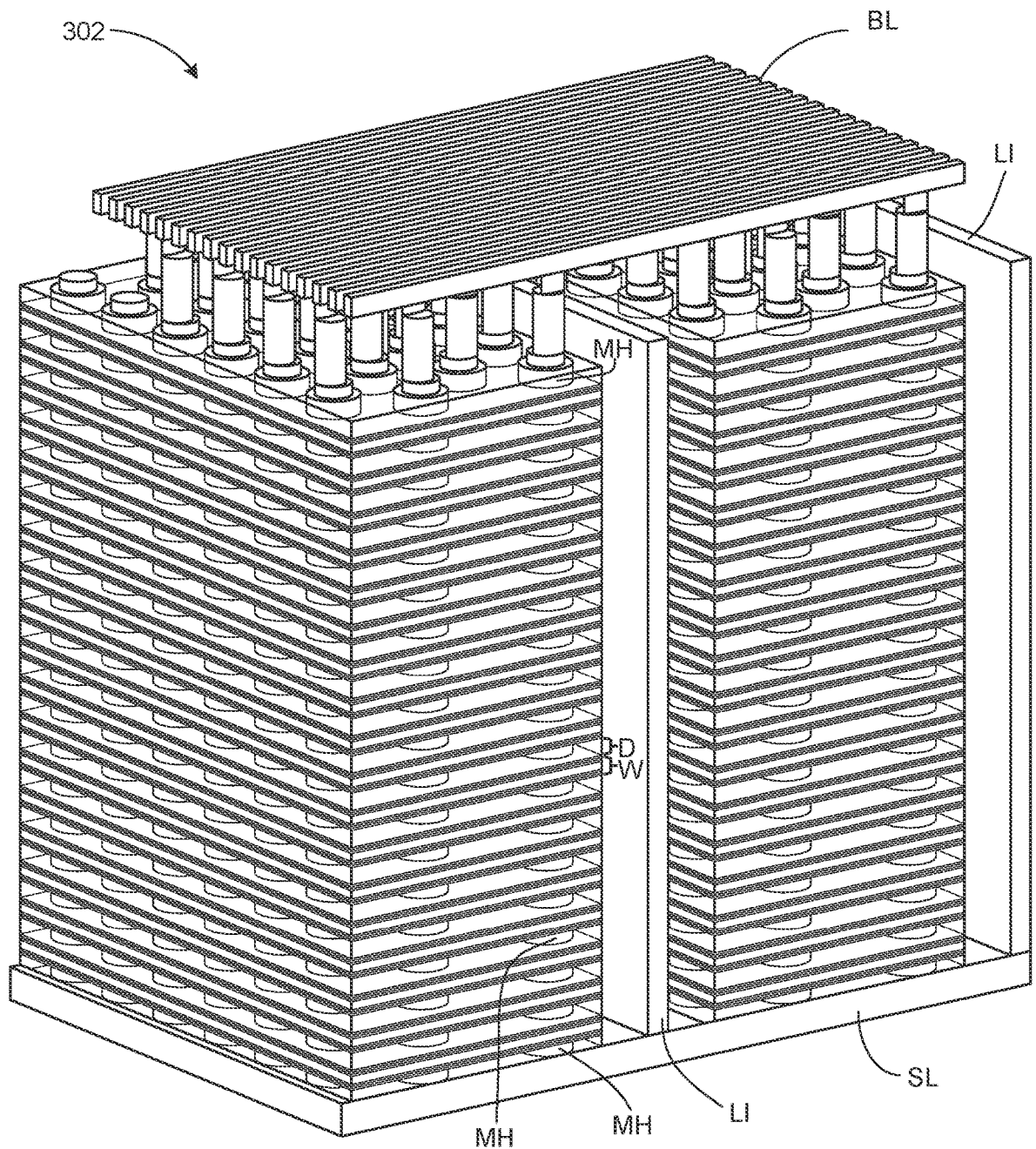
FIG. 6A is a perspective view of a portion of one example embodiment of a monolithic three dimensional memory array that can comprise memory structure.

FIG. 6A is a perspective view of a portion of one example embodiment of a monolithic three dimensional memory array that can comprise memory structure 302, which includes a plurality non-volatile memory cells. For example, FIG. 6A shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The word line layers contain one or more word lines that are connected to memory cells. For example, a word line may be connected to a control gate of a memory cell. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 6A shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 6A, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 6B:
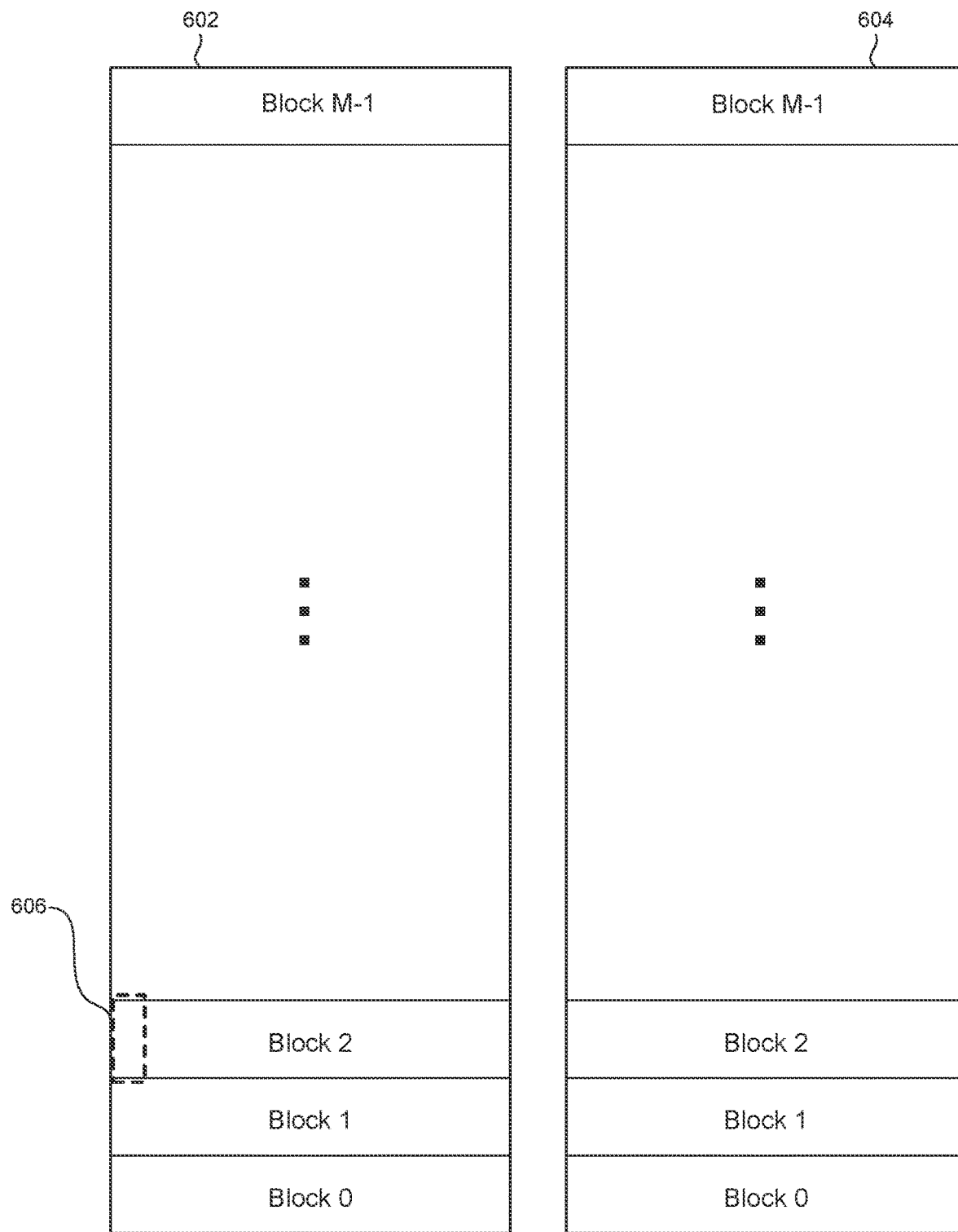
FIG. 6B is a block diagram explaining one example organization of memory structure.

FIG. 6B is a block diagram explaining one example organization of memory structure 302, which is divided into two planes 602 and 604. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 602 includes block 0, 2, 4, 6, . . . and plane 604 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 302 to enable the signaling and selection circuits.

Figure 6C:
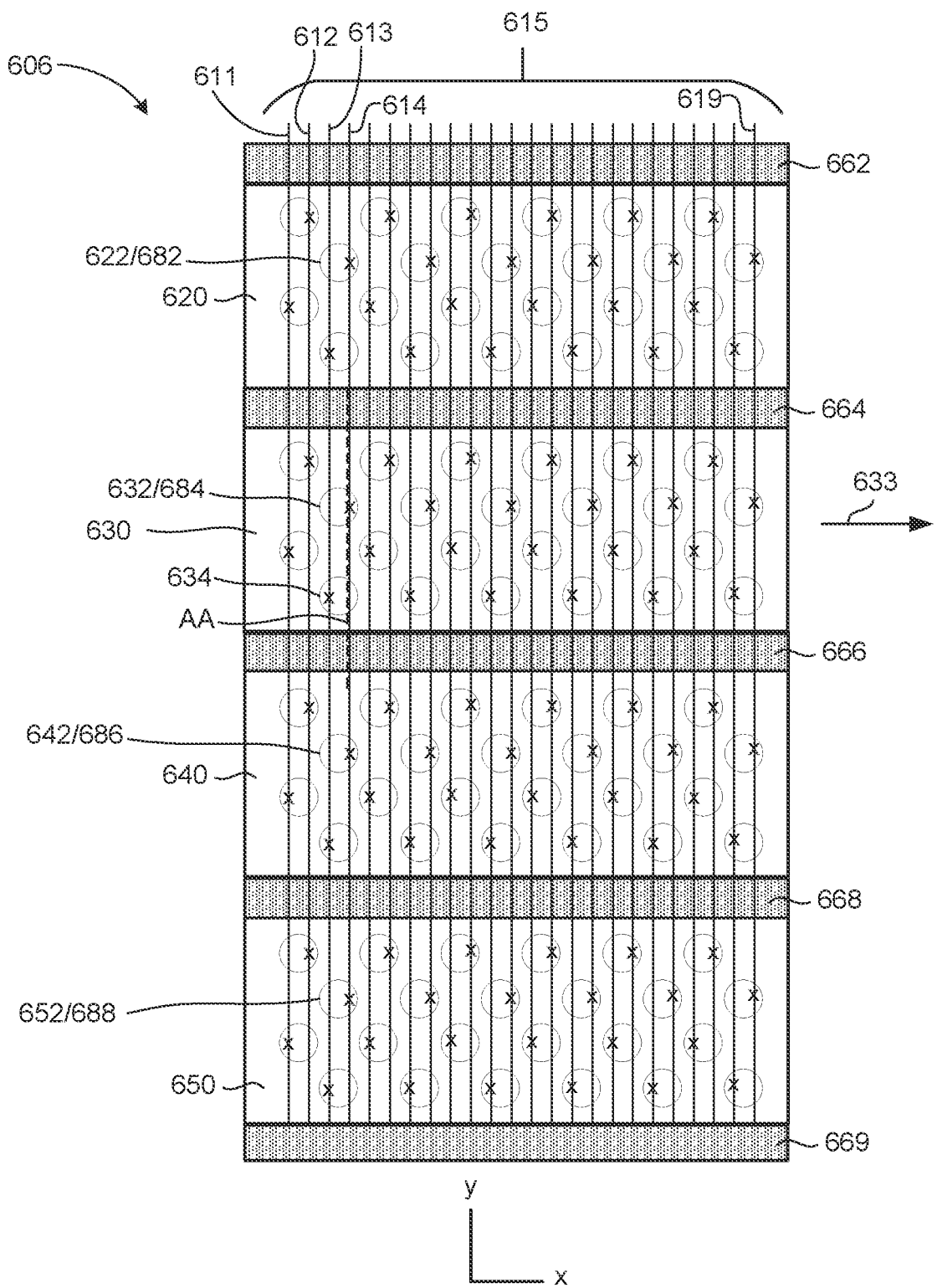
FIG. 6C is a block diagram depicting a top view of a portion of one block from the memory structure.
Figure 6D:
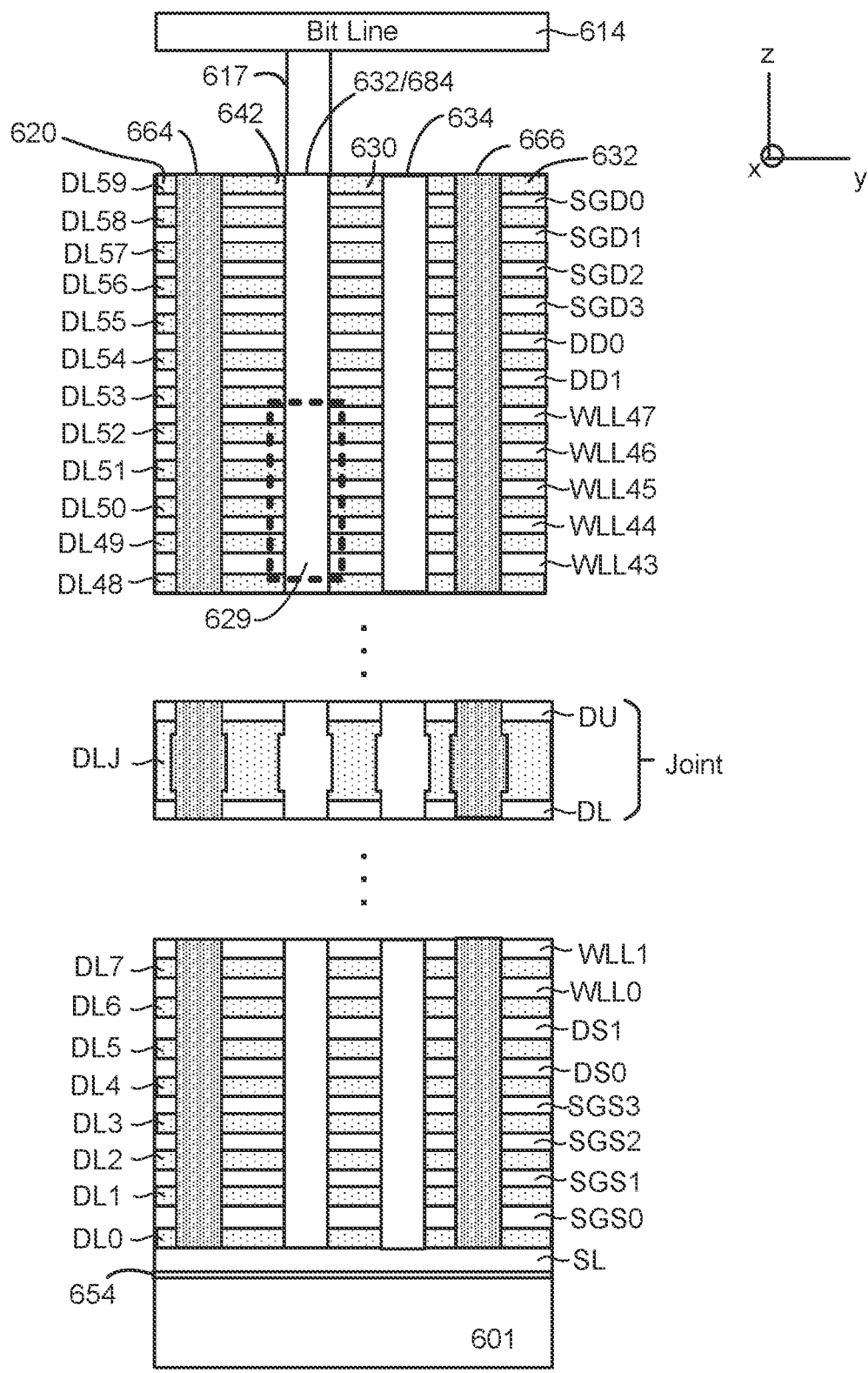
FIG. 6D depicts a portion of an embodiment of three dimensional memory structure showing a cross-sectional view along line AA of FIG. 6C.
Figure 6E:
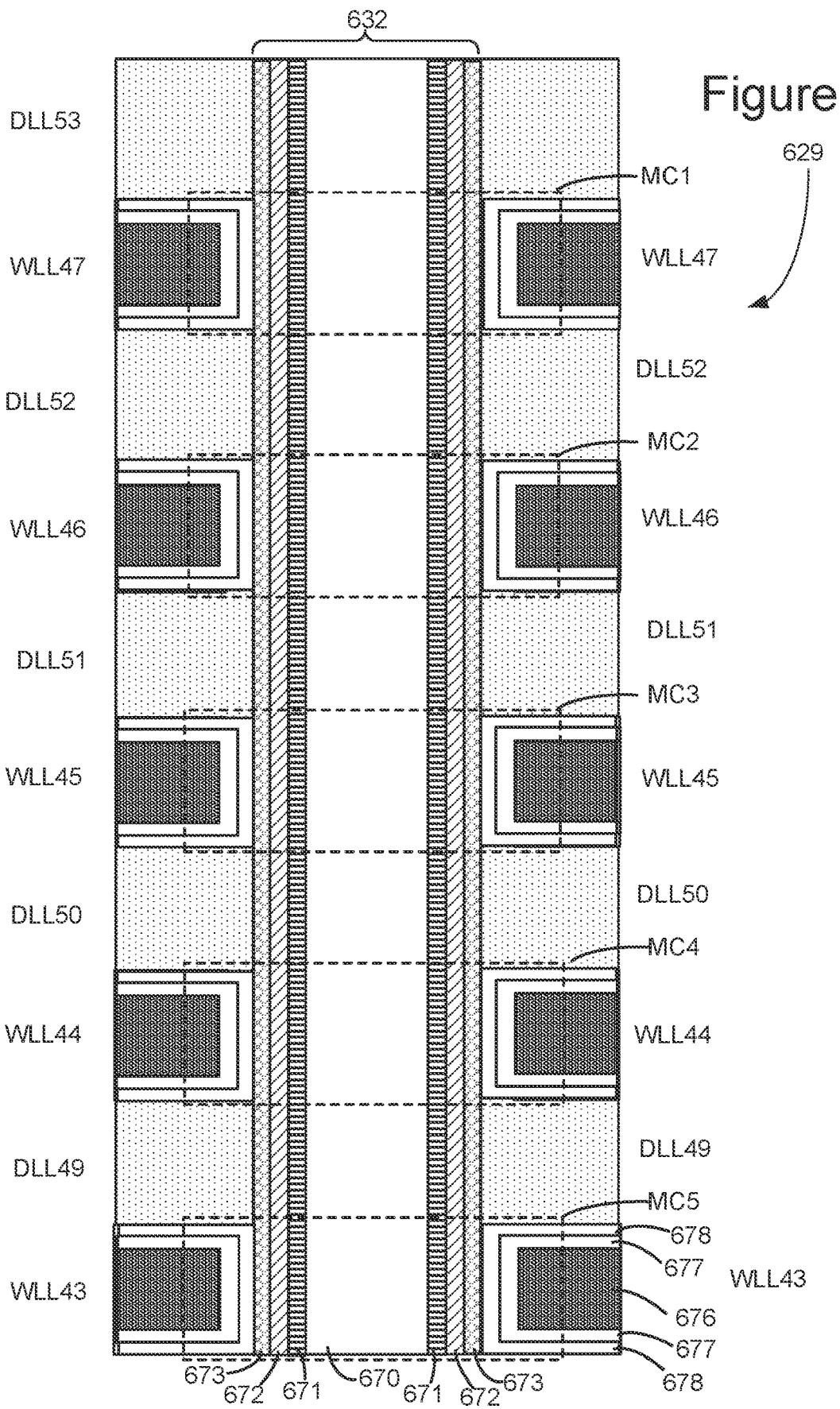
FIG. 6E depicts a cross sectional view of region of FIG. 6D that includes a portion of a vertical column.

FIGS. 6C-6E depict an example 3D NAND structure. FIG. 6C is a block diagram depicting a top view of a portion of one block from memory structure 302. The portion of the block depicted in FIG. 6C corresponds to portion 606 in block 2 of FIG. 6B. As can be seen from FIG. 6C, the block depicted in FIG. 6C extends in the direction of 633. In one embodiment, the memory array will have 60 layers. Other embodiments have less than or more than 60 layers. However, FIG. 6C only shows the top layer.

FIG. 6C depicts a plurality of circles that represent the vertical columns. Each of the vertical columns include multiple select transistors and multiple memory cells. In one embodiment, each vertical column implements a NAND string. For example, FIG. 6C depicts vertical columns 622, 632, 642 and 652. Vertical column 622 implements NAND string 682. Vertical column 632 implements NAND string 684. Vertical column 642 implements NAND string 686. Vertical column 652 implements NAND string 688. More details of the vertical columns are provided below. Since the block depicted in FIG. 6C extends in the direction of arrow 633 and in the direction of arrow 633, the block includes more vertical columns than depicted in FIG. 6C.

FIG. 6C also depicts a set of bit lines 615, including bit lines 611, 612, 613, 614, . . . , 619. FIG. 6C shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 614 is connected to vertical columns 622, 632, 642 and 652.

The block depicted in FIG. 6C includes a set of local interconnects 662, 664, 666, 668 and 669 that connect the various layers to a source line below the vertical columns. Local interconnects 662, 664, 666, 668 and 669 also serve to divide each layer of the block into four regions; for example, the top layer depicted in FIG. 6C is divided into regions 620, 630, 640 and 650, which are referred to as fingers or sub-blocks. In the layers of the block that implement memory cells, the four regions are referred to as word line sub-blocks that are separated by the local interconnects. In one embodiment, the word line sub-blocks on a common level of a block connect together at the end of the block to form a single word line. In another embodiment, the word line sub-blocks on the same level are not connected together. In one example implementation, a bit line only connects to one vertical column in each of regions 620, 630, 640 and 650. In that implementation, each block has sixteen rows of active columns and each bit line connects to four rows in each block. In one embodiment, all of four rows connected to a common bit line are connected to the same word line (via different word line sub-blocks on the same level that are connected together). Therefore, the system uses the source side select lines and the drain side select lines to choose one (or another subset) of the four to be subjected to a memory operation (program, verify, read, and/or erase).

Although FIG. 6C shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 6C also shows the vertical columns being staggered. In other embodiments, different patterns of staggering can be used. In some embodiments, the vertical columns are not staggered.

FIG. 6D depicts a portion of an embodiment of three dimensional memory structure 302 showing a cross-sectional view along line AA of FIG. 6C. This cross sectional view cuts through vertical columns 632 and 634 and region 630 (see FIG. 6C). The structure of FIG. 6D includes: four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or fewer than four drain side select layers, more or fewer than four source side select layers, more or fewer than four dummy word line layers, and more or fewer than forty eight word line layers (e.g., 96 word line layers). Vertical columns 632 and 634 are depicted protruding through the drain side select layers, source side select layers, dummy word line layers and word line layers. In one embodiment, each vertical column comprises a NAND string. For example, vertical column 632 comprises NAND string 684. Below the vertical columns and the layers listed below is substrate 601, an insulating film 654 on the substrate, and source line SL. The NAND string of vertical column 632 has a source end at a bottom of the stack and a drain end at a top of the stack. As in agreement with FIG. 6C, FIG. 6D show vertical column 632 connected to Bit Line 614 via connector 617. Local interconnects 664 and 666 are also depicted.

For case of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

In some embodiments, the word lines are read sequentially, which means that the word lines are read either from low to high (e.g., WLL0 to WLL47) or from high to low (e.g., WLL47 to WLL0). It is not required to read the entire set of word lines when reading sequentially. Techniques are disclosed herein for providing compensation for interference caused by adjacent memory cells on target memory cells during a sequential read.

In some embodiments, the read of an individual word line is broken down into separate reads of sub-blocks. Referring again to FIG. 6C, the block is divided into four sub-blocks 620, 630, 640, 650. Thus, the four sub-blocks on one word line layer may be read, prior to reading the four sub-blocks on an adjacent word line layer. In some embodiments, data state information is used to provide compensation on a sub-block basis. For example, data state information for memory cells at WLL35 is kept for each of the four sub-blocks 620-650. Then, when reading sub-block 620 at WLL36 the data state information for sub-block 620 at WLL35 is used to compensate for interference from adjacent memory cells in sub-block 620 at WLL35, when reading sub-block 630 at WLL36 the data state information for sub-block 630 at WLL35 is used to compensate for interference from adjacent memory cells in sub-block 620 at WLL35, etc.

For three dimensional NAND memory arrays having large numbers of word lines, one or more joint regions may be included. The use of a joint can simply the fabrication process and, in some embodiments, allow for sub-block level operations by accessing word lines only above or below the joint. The joint region will often have thicker dielectric region DLJ than between other word lines. As with the source and drain ends, one or more dummy word lines may be included above (DU) and below (DL) the joint.

FIG. 6E depicts a cross sectional view of region 629 of FIG. 6D that includes a portion of vertical column 632. In one embodiment, the vertical columns are round and include four layers; however, in other embodiments more or less than four layers can be included and other shapes can be used. In one embodiment, vertical column 632 includes an inner core layer 670 that is made of a dielectric, such as $SiO_2$. Other materials can also be used. Surrounding inner core 670 is polysilicon channel 671. Materials other than polysilicon can also be used. Note that it is the channel 671 that connects to the bit line. Surrounding channel 671 is a tunneling dielectric 672. In one embodiment, tunneling dielectric 672 has an ONO structure. Surrounding tunneling dielectric 672 is charge trapping layer 673, such as (for example) Silicon Nitride. Other memory materials and structures can also be used. The technology described herein is not limited to any particular material or structure.

FIG. 6E depicts dielectric layers DLL49, DLL50, DLL51, DLL52 and DLL53, as well as word line layers WLL43, WLL44, WLL45, WLL46, and WLL47. Each of the word line layers includes a word line region 676 surrounded by an aluminum oxide layer 677, which is surrounded by a blocking oxide (SiO$_2$) layer 678. The physical interaction of the word line layers with the vertical column forms the memory cells. Thus, a memory cell, in one embodiment, comprises channel 671, tunneling dielectric 672, charge trapping layer 673, blocking oxide layer 678, aluminum oxide layer 677 and word line region 676. For example, word line layer WLL47 and a portion of vertical column 632 comprise a memory cell MC1. Word line layer WLL46 and a portion of vertical column 632 comprise a memory cell MC2. Word line layer WLL45 and a portion of vertical column 632 comprise a memory cell MC3. Word line layer WLL44 and a portion of vertical column 632 comprise a memory cell MC4. Word line layer WLL43 and a portion of vertical column 632 comprise a memory cell MC5. In other architectures, a memory cell may have a different structure; however, the memory cell would still be the storage unit.

Note that the charge trapping layer 673 may extend from one end of the NAND string to the other, and hence may be referred to herein as a continuous charge trapping layer. When a memory cell is programmed, electrons are stored in a portion of the charge trapping layer 673 which is associated with the memory cell. These electrons are drawn into the charge trapping layer 673 from the channel 671, through the tunneling dielectric 672, in response to an appropriate voltage on word line region 676. The Vt of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 6F:
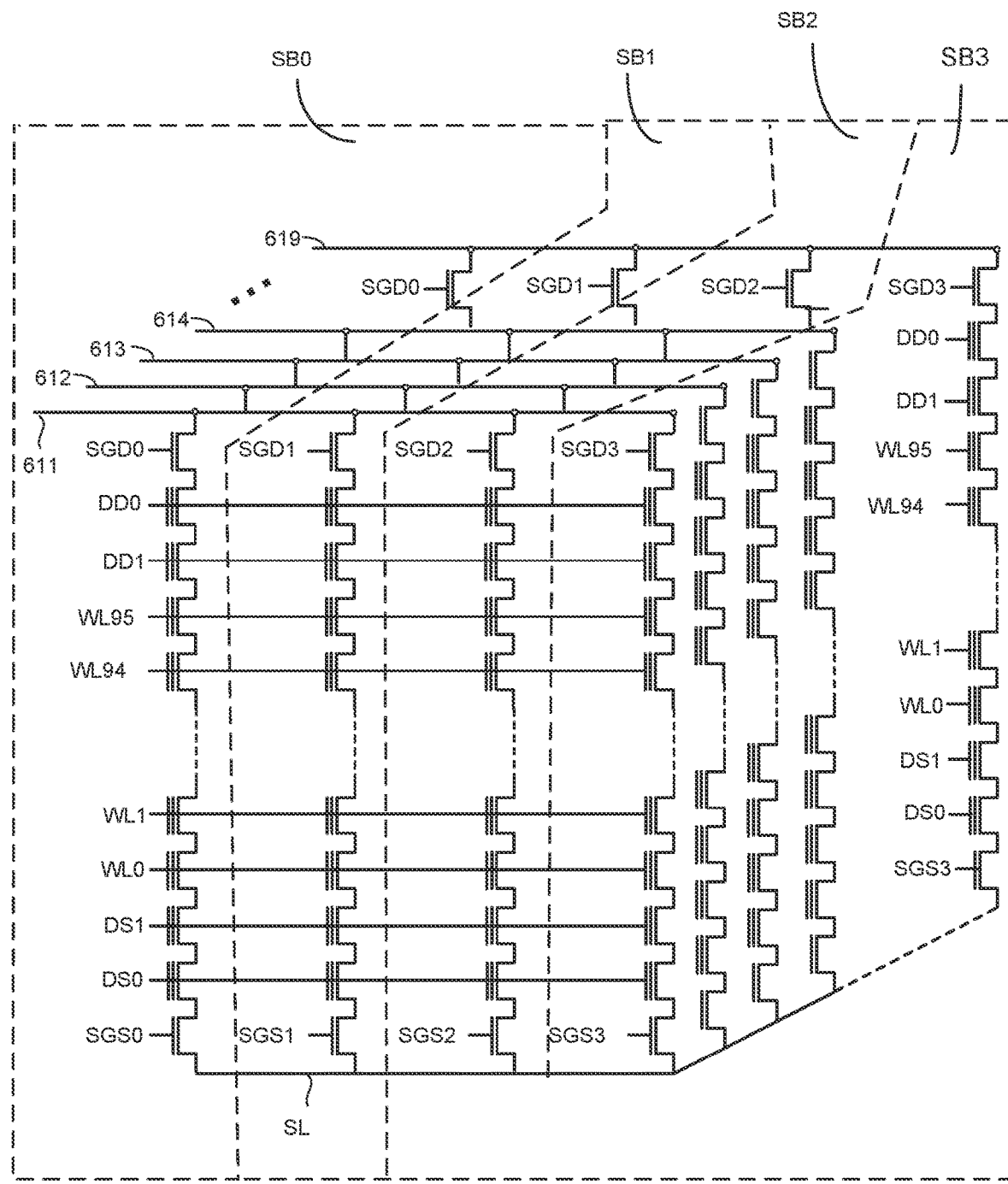
FIG. 6F is a schematic of a plurality of NAND strings showing multiple sub-blocks.

FIG. 6F is a schematic diagram of a portion of the memory depicted in in FIGS. 6A-6E. FIG. 6F shows physical word lines WLL0-WLL95 running across the entire block. The structure of FIG. 6F corresponds to portion 606 in Block 2 of FIGS. 6A-6E, including bit lines 611, 612, 613, 614, . . . , 619. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 6A-6F is a three dimensional memory structure that includes vertical NAND strings with charge-trapping material, other (2D and 3D) memory structures (e.g., MRAM, ReRAM, PCM) can also be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate.

FIG. 7A is a graph of threshold voltage versus number of memory cells, and illustrates example threshold voltage distributions for the memory array when each memory cell stores one bit of data. FIG. 7A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." Memory cells that store one bit of data are referred to as single level cells ("SLC").

FIG. 7B is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). Memory cells that store more than one bit of data are referred to as multi-level cells ("MLC"). FIG. 7B shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed data states. In some embodiments, data states S1-S7 can overlap, with controller 122 relying on error correction to identify the correct data being stored.

FIG. 7B shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in. In FIG. 7A, read reference voltage Vr is used to test whether memory cells are erased or programmed.

FIG. 7B also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 7B represent the full sequence programming. The technology described herein can also be used with other types of programming in addition to full sequence programming including (but not limited to) multiple stage/phase programming.

Each threshold voltage distribution (data state) of FIG. 7B corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 7C is a table describing one example of an assignment of data values to data states. In the table of FIG. 7B, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. Referring back to FIG. 4, in one embodiment the ADL, BDL, and CDL data latches can respectively be used for the lower, middle, and upper page data values of a memory cell during a program operation.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 6) or verify operation (e.g. see verify reference voltages Vv1, Vv2, Vv3, Vv4, Vv5, Vv6, and Vv7 of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 8:
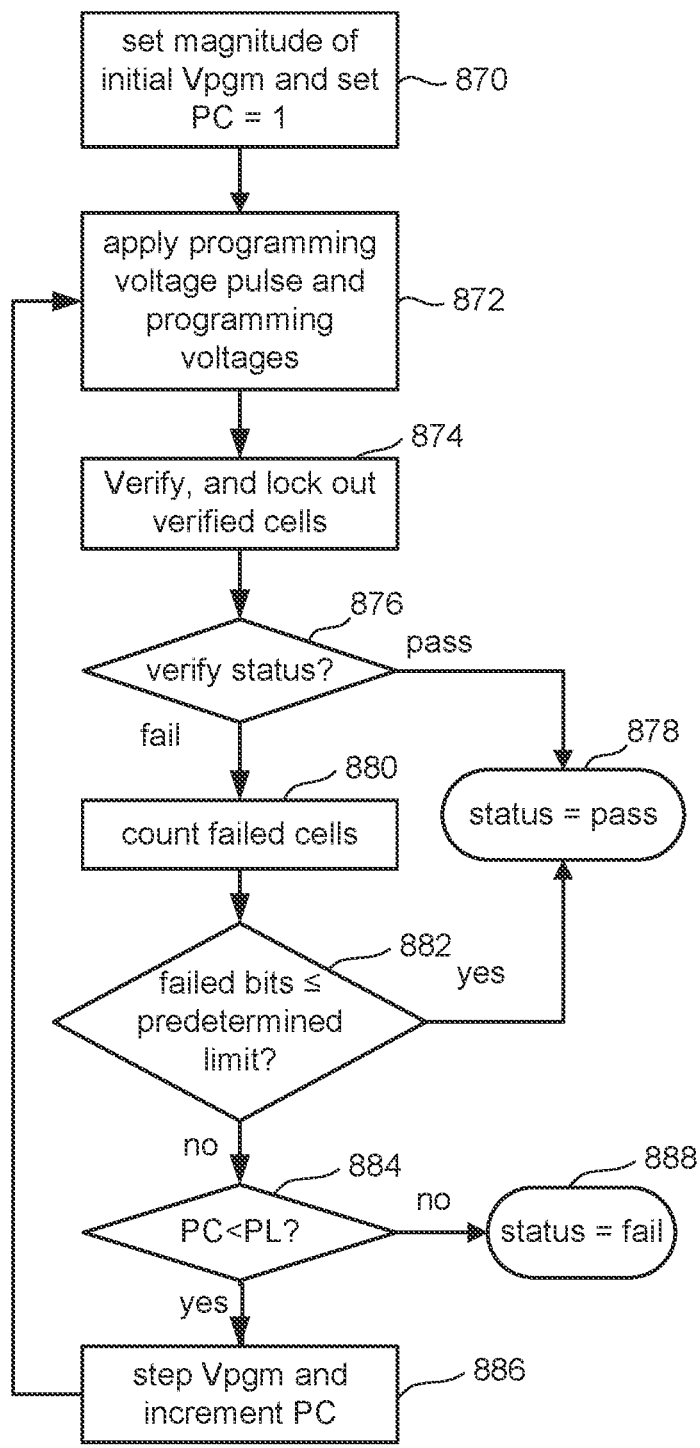
FIG. 8 is a flow chart describing one embodiment of a process for programming non-volatile memory.

FIG. 8 is a flowchart describing one embodiment of a process for programming that is performed by memory die 300/307. In one example embodiment, the process of FIG. 8 is performed on memory die 300/307 using the control circuit discussed above, at the direction of state machine 362. The process of FIG. 8 is performed to implement the programming of FIG. 7A, the full sequence programming of FIG. 7B, or other programming schemes including multi-stage programming. When implementing multi-stage programming, the process of FIG. 8 is used to implement any/each stage of the multi-stage programming process.

Figure 9:
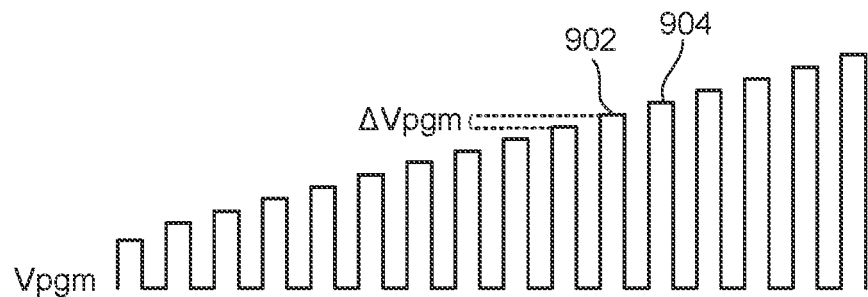
FIG. 9 depicts a series of programming voltage pulses.

Typically, a programming signal Vpgm is applied to the control gates (via a selected word line) during a program operation as a series of programming voltage pulses, as depicted in FIG. 9. Between programming pulses are a set of verify pulses to perform verification. In many implementations, the magnitude of the program pulses is increased with each successive pulse by a predetermined step size $\Delta Vpgm$ (e.g., 0.2 v-0.5 v). In step 870 of FIG. 8, the programming voltage (Vpgm) is initialized to the starting magnitude (e.g., ~12-16V or another suitable level) and a program counter PC maintained by state machine 362 is initialized at 1. In step 872, a program pulse of the programming signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. In one embodiment, if a memory cell should be programmed, then the corresponding bit line is grounded. On the other hand, if the memory cell should remain at its current threshold voltage, then the corresponding bit line is connected to Vdd (e.g., 1-3.5 volts) to inhibit programming. In step 872, the programming voltage pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 874, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 876, it is determined whether all the memory cells have reached their target threshold voltages (pass). If so, the programming process is complete and successful because all selected memory cells were programmed and verified to their target states. A status of "PASS" (or success) is reported in step 878. If, in 876, it is determined that not all of the memory cells have reached their target threshold voltages (fail), then the programming process continues to step 880.

In step 880, the system counts the number of memory cells that have not yet reached their respective target threshold voltage distribution. That is, the system counts the number of memory cells that have, so far, failed the verify process. This counting can be done by the state machine 362, the controller 102, or other logic. In one implementation, each of the sense blocks will store the status (pass/fail) of their respective memory cells. In one embodiment, there is one total count, which reflects the total number of memory cells currently being programmed that have failed the last verify step. In another embodiment, separate counts are kept for each data state.

In step 882, it is determined whether the count from step 880 is less than or equal to a predetermined limit. In one embodiment, the predetermined limit is a number of bits that can be corrected by error correction codes (ECC) during a read process for the page of memory cells. If the number of failed cells is less than or equal to the predetermined limit, then the programming process can stop and a status of "PASS" is reported in step 878. In this situation, enough memory cells were programmed correctly such that the few remaining memory cells that have not been completely programmed can be corrected using ECC during the read process. In some embodiments, step 880 will count the number of failed cells for each sector, each target data state or other unit, and those counts will individually or collectively be compared to one or more thresholds in step 882.

In one embodiment, the predetermined limit can be less than the total number of bits that can be corrected by ECC during a read process to allow for future errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, then the programming process continues at step 884 and the program counter PC is checked against the program limit value (PL). Examples of program limit values include 6, 20 and 30; however, other values can be used. If the program counter PC is not less than the program limit value PL, then the program process is considered to have failed and a status of FAIL is reported in step 888. If the program counter PC is less than the program limit value PL, then the process continues at step 886 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 886, the process loops back to step 872 and another program pulse is applied to the selected word line so that another iteration (steps 872-886) of the programming process of FIG. 8 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, controller 102 receives host data (also referred to as user data or data from an entity external to the memory system), also referred to as information bits, that is to be stored non-volatile memory structure 302. The informational bits are represented by the matrix i=[1 0] (note that two bits are used for example purposes only, and many embodiments have code words longer than two bits). An error correction coding process (such as any of the processes mentioned above or below) is implemented by ECC engine 226/256 of controller 102 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, Jan. 1962; and D. MacKay, Information Theory, Inference and Learning Algorithms, Cambridge University Press 2003, chapter 47. In practice, such LDPC codes are typically applied (e.g., by ECC engine 226/256) to multiple pages encoded across a number of storage elements, but they do not need to be applied across multiple pages. The data bits can be mapped to a logical page and stored in memory structure 302 by programming one or more memory cells to one or more programming states, which corresponds to v.

In one embodiment, programming serves to raise the threshold voltage of the memory cells to one of the programmed data states S1-S7. Erasing serves to lower the threshold voltage of the memory cells to the Erase data state S0.

One technique to erase memory cells in some memory devices is to bias a p-well (or other types of) substrate to a high voltage to charge up a NAND channel. An erase enable voltage is applied to control gates of memory cells while the NAND channel is at a high voltage to erase the non-volatile storage elements (memory cells). Another approach to erasing memory cells is to generate gate induced drain leakage (GIDL) current to charge up the NAND string channel. An erase enable voltage is applied to control gates of the memory cells, while maintaining the string channel potential to erase the memory cells.

In one embodiment, the GIDL current is generated by causing a drain-to-gate voltage at a select transistor. A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to a bit line to generate a first GIDL current. A second GIDL voltage may be created between two terminals of a select transistor (e.g., source side select transistor) that is connected to a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 10:
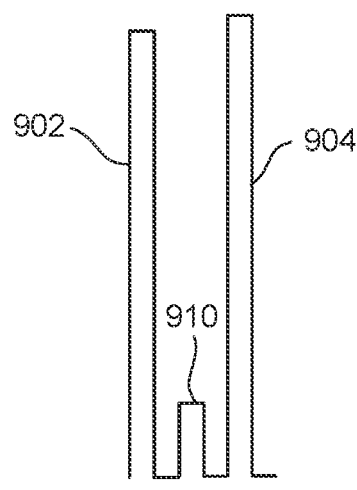
FIG. 10 depicts two programming voltage pulses and a verify voltage pulse.
Figure 11:
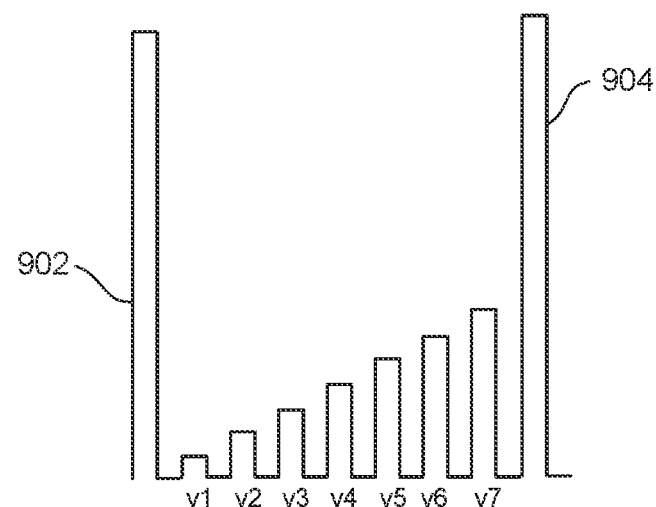
FIG. 11 depicts two programming voltage pulses and a set of verify voltage pulses.

As discussed above, FIG. 9 depicts the programming signal Vpgm as a series of programming voltage pulses. These programming voltage pulses are one example of doses of programming applied to a plurality of non-volatile memory cells being programmed to a data state. As described by FIG. 8, the system performs program verification between the doses of programming, as depicted in FIGS. 10 and 11. FIG. 10, which illustrates an embodiment in which memory cells store one bit of data per memory cell, depicts two of the programming voltage pulses 902 and 904 of FIG. 9. Between programming voltage pulses 902 and 904 is verify voltage pulse 910. In one embodiment, verify voltage pulse 910 has a magnitude of Vv (see FIG. 7A) and represents the system performing program verification (step 874) between the doses of programming (successive iterations of step 872).

FIG. 11, which illustrates an embodiment in which memory cells store three bits of data per memory cell, depicts two of the programming voltage pulses 902 and 904 of FIG. 9. Between programming voltage pulses 902 and 904 are verify voltage pulses v1, v2, v3, v4, v5, v6 and v7. In one embodiment, verify voltage pulse v1 has a magnitude of Vv1 (see FIG. 7B), verify voltage pulse v2 has a magnitude of Vv2, verify voltage pulse v3 has a magnitude of Vv3, verify voltage pulse v4 has a magnitude of Vv4, verify voltage pulse v5 has a magnitude of Vv5, verify voltage pulse v6 has a magnitude of Vv6, and verify voltage pulse v7 has a magnitude of Vv7. Verify voltage pulses v1, v2, v3, v4, v5, v6 and v7 represent the system performing program verification (step 874) between the doses of programming (successive iterations of step 872).

Figure 12:
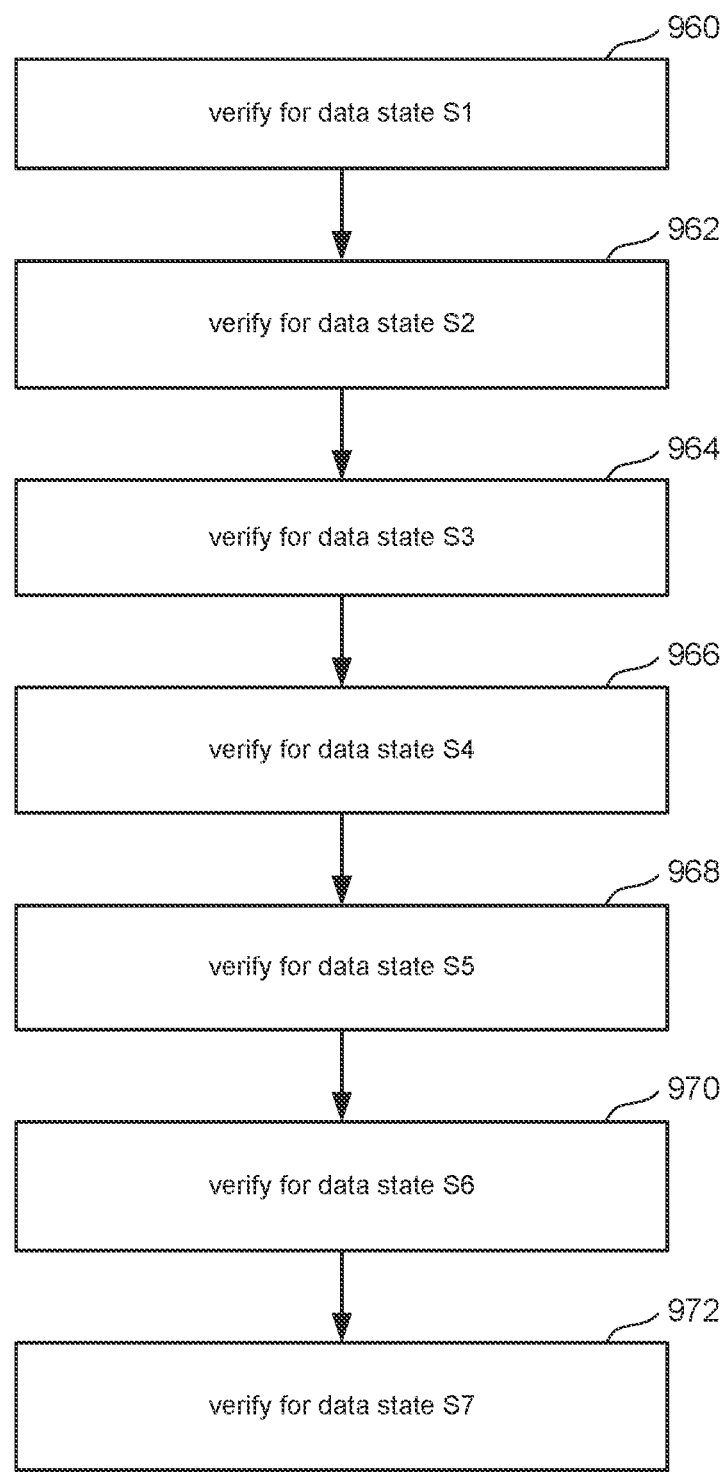
FIG. 12 is a flow chart describing one embodiment of a process for verifying programming of non-volatile memory.

FIG. 12 is a flow chart describing one embodiment of a process for verifying programming of non-volatile memory. That is, the process of FIG. 12 is a process performed during an example implementation of step 874 of FIG. 8 for an embodiment in which memory cells store three bits of data per memory cell. The process of FIG. 12 is performed using the waveforms of FIGS. 9 and 11. In step 960 of FIG. 12, the system performs verification for data state S1. For example, the system tests whether memory cells being programmed to data state S1 have threshold voltages greater than Vv1 (e.g., applying verify voltage pulse v1 of FIG. 11 to the control gates of memory cells being programmed to data state S1).

In step 962, the system performs verification for data state S2. For example, the system tests whether memory cells being programmed to data state S2 have threshold voltages greater than Vv2 (e.g., applying verify voltage pulse v2 of FIG. 11 to the control gates of memory cells being programmed to data state S2).

In step 964, the system performs verification for data state S3. For example, the system tests whether memory cells being programmed to data state S3 have threshold voltages greater than Vv3 (e.g., applying verify voltage pulse v3 of FIG. 11 to the control gates of memory cells being programmed to data state S3).

In step 966, the system performs verification for data state S4. For example, the system tests whether memory cells being programmed to data state S4 have threshold voltages greater than Vv4 (e.g., applying verify voltage pulses v4 of FIG. 11 to the control gates of memory cells being programmed to data state S4).

In step 968, the system performs verification for data state S5. For example, the system tests whether memory cells being programmed to data state S5 have threshold voltages greater than Vv5 (e.g., applying verify voltage pulses v5 of FIG. 11 to the control gates of memory cells being programmed to data state S5).

In step 970, the system performs verification for data state S6. For example, the system tests whether memory cells being programmed to data state S6 have threshold voltages greater than Vv6 (e.g., applying verify voltage pulse v6 of FIG. 11 to the control gates of memory cells being programmed to data state S6).

In step 972, the system performs verification for data state S7. For example, the system tests whether memory cells being programmed to data state S7 have threshold voltages greater than Vv7 (e.g., applying verify voltage pulse v7 of FIG. 11 to the control gates of memory cells being programmed to data state S7). Note that, in one embodiment, steps 960-972 are performed between doses of programming (e.g., between programming voltage pulses). In some embodiments, one or more of steps 960-972 can be skipped between certain programming voltage pulses. In one embodiment, steps 960-972 are performed sequentially (in any order or in the order depicted), while in other embodiments steps 960-972 are performed in parallel (e.g., concurrently).

The flow of FIG. 12 illustrates the verification of all of the target data states, but to speed up the verification phase of a programming operation a "smart verify" operation can be used. In a smart verify, not all of the target data state levels are checked. Initially, for the first few programming pulses, only the lower data states need to be checked. As the programming operation continues, and as the lower target data states begin to verify, additional higher data states are included; and, as the lower states finish, the lower target state verifies can be dropped out.

A program operation can include a single programming pass or multiple programming passes, where each pass uses incremental step pulse programming, for instance. The verify voltages in each program loop, including example verification signals v1-v7 in FIG. 11, can encompass lower assigned data states and then midrange assigned data states and then higher assigned data states as the program operations proceeds. FIG. 11 shows use of all of v1-v7 between pulses 902 and 904, but in a smart verify operation usually only a subset is used. The verify voltages are part of a sensing operation. Memory cells are sensed during the application of the verification signal to judge their programming progress. A verify voltage is used to judge the programming progress of a memory cell. For example, as discussed in the next few paragraphs, FIG. 13 uses verify voltages (plots 1307 and 1308) for the S1 and S2 state, Vv1 and Vv2, respectively. The result of sensing of the Vth relative to its verify voltage can be used to inhibit further programming of a memory cell.

Figure 13:
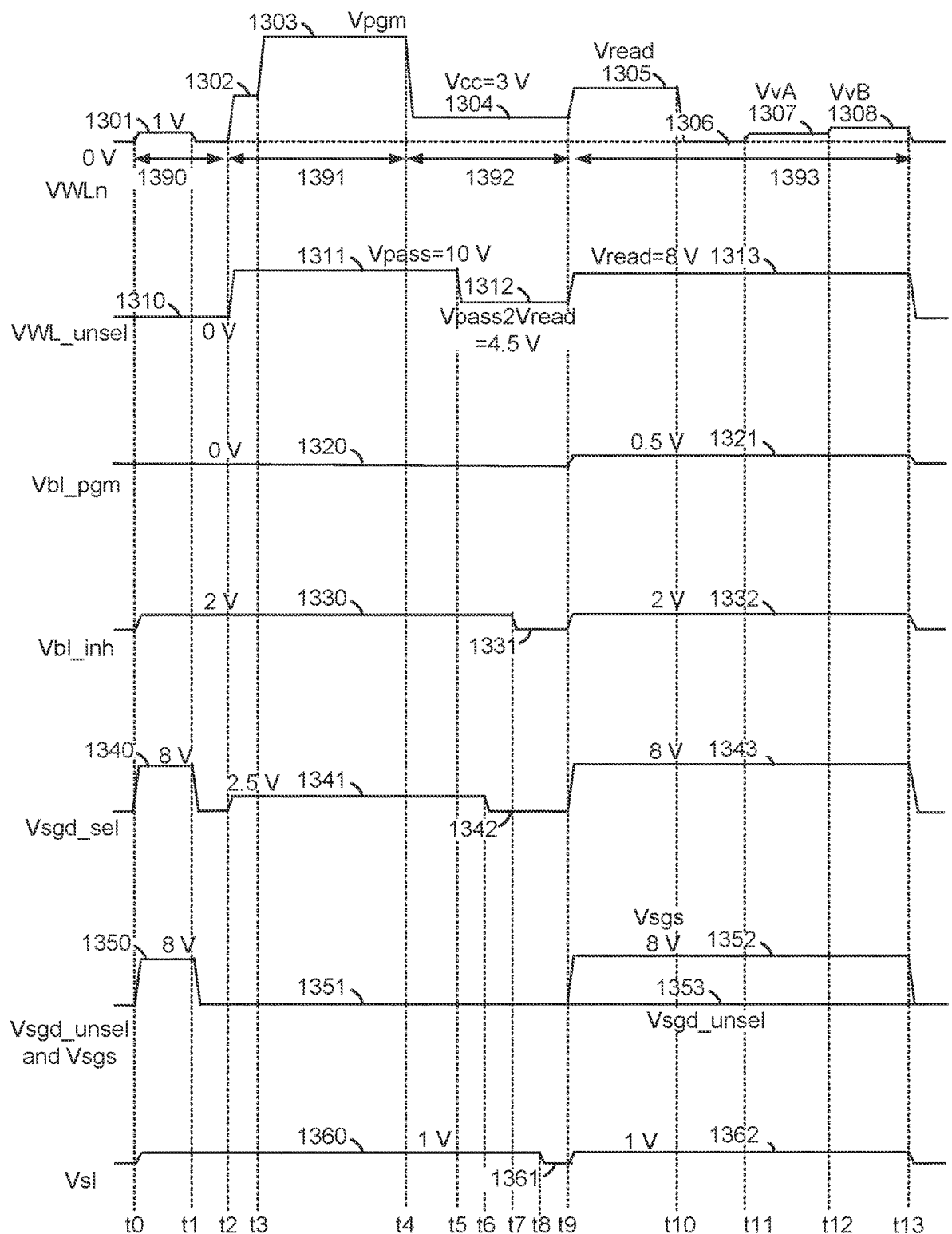
FIG. 13 is an embodiment for a set programming waveforms for NAND memory.

FIG. 13 is an embodiment for a set programming waveforms for NAND memory. A number of different variations are possible depending on the embodiment, but Figure provides an example of the different voltages involved in a program operation. In FIG. 13, the vertical dimension denotes voltage and the horizontal dimension denotes time, with time points t0-t13. The period of time depicted corresponds to one program loop and includes a pre-charge phase 1390 (t0-t2), a program phase 1391 (t2-t4), a recovery phase 1392 (t4-t9), and a verify phase 1393 (t9-t13). The voltages depicted are examples.

The top waveform depicts voltages applied to a selected word line. WLn, in a first program loop of a program operation as described with respect to FIGS. 7A-12. A plot 1301 represents 1 V, a plot 1302 represents a program pass voltage, Vpass, a plot 1303 represents a program voltage of Vpgm, a plot 1304 represents a positive recovery voltage of Vcc=3V, a plot 1305 represents a voltage pulse at Vread, a plot 1306 represents 0V, and plots 1307 and 1308 represent example verify voltages VvA and VvB, respectively, where in a first programming loop these could correspond to Vv1 and Vv2 of FIG. 11. During the application of each verify voltage, a sensing operation occurs for the selected memory cells which are assigned to the data state being verified. The selected memory cells are connected to a selected word line, and can be in a selected sub-block. A program pulse comprises the plots 1302 and 1303.

The second waveform depicts a voltage, VWL_unsel, applied to unselected word lines. When programming or reading the memory cell on a selected word line, the non-selected memory cells along a NAND string needs to be turned on sufficiently to allow the programming or sensing for the selected memory cell. A plot 1310 represents 0V, a plot 1311 represents Vpass=10 V, and a plot 1312 represents a positive recovery or transition voltage, Vpass2Vread. This refers to a voltage which is applied in a transition from the program pass voltage to the read pass voltageA plot 1313 represents Vread, where depending on the embodiments, the Vread value used in a verify operation can be the same as used in the sensing operation of a data read.

The third line of FIG. 13 depicts a voltage Vbl_pgm, applied to bit lines of program selected NAND strings, enabling them to create a sufficient channel voltage to increase the stored change level of a memory cell on a selected bit line and selected word line. A plot 1320 represents 1 V, and a plot 1321 represents 0.5 V.

The fourth line of FIG. 13 depicts a voltage Vbl_inh applied to non-selected bit lines of NAND strings to inhibit programming. These are inhibited NAND strings in a selected sub-block. A plot 1330 represents 2 V and a plot 1331 represents 0 V at t7-t9 in the recovery phase. A plot 1332 represents 2 V in the verify phase.

The fifth line of FIG. 13 depicts a voltage Vsgd_sel applied to the drain side select gate SGD transistors of a selected sub-block. A plot 1340 represents 8 V, a plot 1341 represents 2.5 V, a plot 1342 represents 0 V and a plot 1343 represents 8 V.

The sixth line of FIG. 13 depicts voltages applied Vsgd_unsel and Vsgs to SGD transistors of unselected sub-blocks and to SGS transistors. A plot 1350 represents 8 V and a plot 1351 represents 2.5 V for Vsgd_unsel and Vsgs. A plot 1352 represents 8 V for Vsgs and a plot 1353 represents 0 V for Vsgd_unsel.

The bottom line of FIG. 13 depicts a voltage Vsl applied to a source line. A plot 1360 represents 1 V, a plot 1361 represents 0 V and a plot 1362 represents 1 V. In the pre-charge phase, a positive Vbl_inh (plot 1330) is provided to the drain-side channels of the inhibited NAND strings to remove residue electrons and to provide a small amount of boosting such as 1-2 V. The SGD transistors of the selected and unselected sub-blocks are in a conductive state at this time, with a voltage of 8 V, for example. This allows the bit line voltage to be passed to the drain end channel. It is also possible for the SGS transistors of the selected and unselected sub-blocks to be in a conductive state at this time, with a voltage of 8 V, for example to allow Vsl to be passed to the source end of the channel. A plot 1331 represents Vbl_inh returning to 0 V at t7-t9 in part of the recovery phase, and a plot 1332 represents Vbl_inh at 2 V during the verify phase, for example.

In the program phase, VWLn and Vwl_unsel are ramped up, e.g., starting at t2, to provide a capacitive coupling up of the channels of the inhibited NAND strings. VWLn is then ramped up further at t3 to the peak level of Vpgm and held at Vpgm until t4. After the application of the program pulse, the word line voltages are ramped down in the recovery phase. Subsequently, in the verify phase, one or more verify tests are performed by applying one or more verify voltages on WLn and, for each verify voltage, sensing the conductive state of the memory cells in the programmed NAND strings of the selected sub-block. Before the verify tests, VWLn is ramped up with VWL_unsel to equalize the channel potential.

During the program pulse, Vsgd_sel is high enough to provide the selected SGD transistors in a conductive state for the programmed NAND strings, which receive Vbl_pgm=0 V, but low enough to provide the selected SGD transistors in a non-conductive state for the inhibited NAND strings, which receive Vbl_inh=2 V. During the verify phase, the SGD and SGS transistors are in a strongly conductive state to allow sensing to occur for the selected memory cells.

Returning to FIGS. 3A and 3B, the voltages VWLn and VWL_unsel are applied to the word lines by the array drivers 324 of the row control circuitry 320 as selected by the circuitry of the row decoder 322 and block select 326 using voltages provided from power control 364. Many of these voltages applied to the word lines are above the on-die supply level of Vcc. For the example values on FIG. 13, Vcc=3V, while Vpgm and Vread applied to VWLn and both of Vpass and Vread applied to the unselected word lines are above this value. To generate these higher voltage levels from Vcc, charge pump circuits 370 can be used to generate this voltage levels above Vcc.

Consequently, charge pumps are important building blocks for NAND flash memories as they are commonly used for providing appropriate bias voltage levels for the NAND arrays to perform not just the program operations as illustrated in FIG. 13, but also for erase and read operations. Charge pumps are similarly used in other non-volatile memory technologies (such as MRAM, ReRAM, and PCM, for example) to provide voltage levels above the supply level, as well as in other applications. The analog circuits of a charge pump can convert a fixed input voltage to a much higher output voltage as needed for the biasing requirements of a NAND memory or other device. The needed charge pumps can occupy significant chip area on a NAND die, an area that is expected to grow in each generation due to the increase in number of word lines that leads to an increase in loading of some of the charge pumps. With decreasing die-size and increased loading, the area of charge pump needs to be efficiently minimized as much as possible.

To address this issue, the following presents charge pumps embodiments using a stage-based frequency optimization for achieving higher area efficiency. In other words, different stages of the charge pump are to be operated at their optimized possible frequency simultaneously instead of single common frequency in order to obtain greater output strength.

A charge pump involves number of identical stages to generate the required output voltage from an input voltage. The number of stages used for a charge pump circuit depends on the output voltage to input voltage multiplication factor indicated by "X", although the actual output is less than this nominal value because of losses due to parasitics. All the stages are operated on a single frequency that gives the best output current for the required output voltage level, thus minimizing the area required. The frequency can be selected as a trade between lowering the frequency, where lower stage to stage charge transfer rates result in lower current outputs, and raising the frequency, where change transfers between stages are less complete.

Figure 14A:
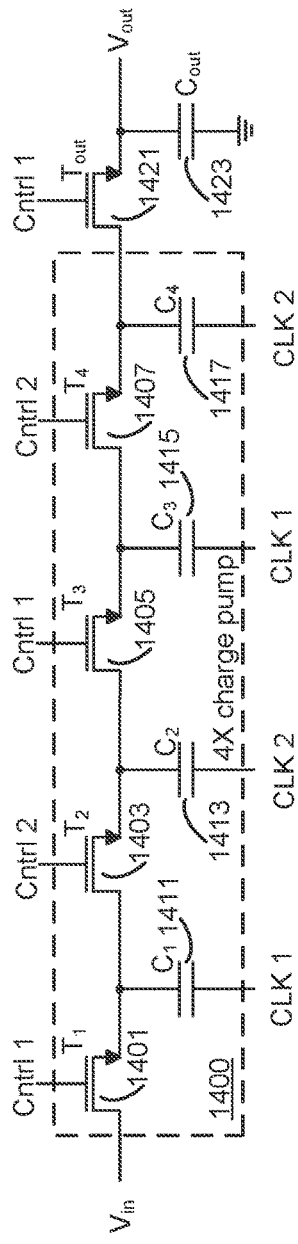
FIGS. 14A and 14B respectively illustrate an example embodiment of a charge pump circuit and operating waveforms.
Figure 14B:
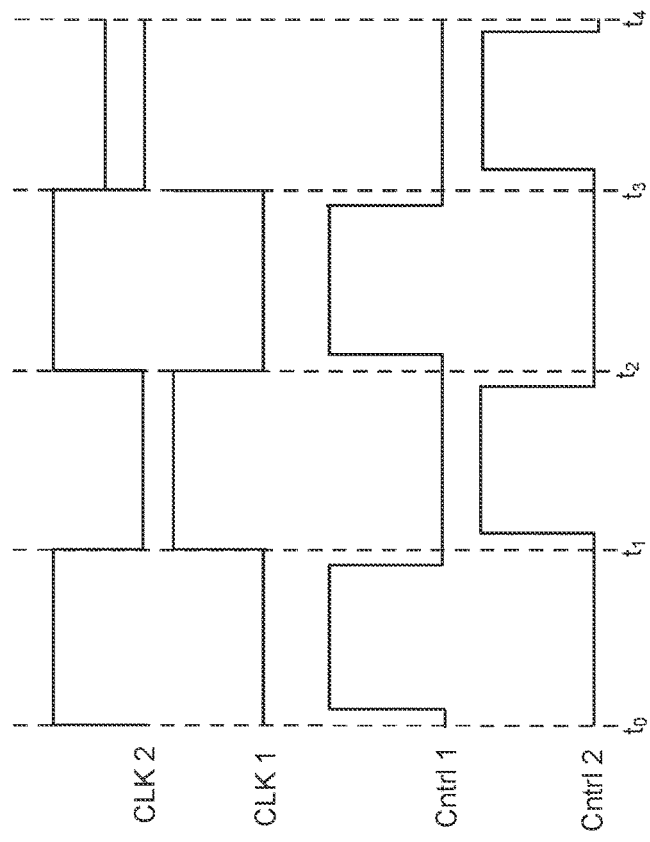

FIGS. 14A and 14B respectively illustrate an example embodiment of a charge pump circuit and operating waveforms. In this example, the charge pump 1400 is a four stage (4X) charge pump of the Dickson type, where each stage is made up of a capacitor and a transfer switch connected between the capacitor and the stage's input. For example, the first stage has the switch $T_1$ 1401 connected between the input voltage node and the capacitor $C_1$ 1411, with the subsequent stages made up of $T_2$ 1403/$C_2$ 1413, $T_3$ 1405/$C_3$ 1415, and $T_4$ 1407/$C_4$ 1417, and the output of each stage serving as input the next stage, with the last stage generating the output voltage $V_{out}$. FIG. 14A also includes the output elements of switch $T_{out}$ 1421 and reservoir capacitor $C_{out}$ 1423, where the switch $T_{out}$ 1421 passes $V_{out}$ from charge pump 1400 stages to be stored on $C_{out}$ 1423. In the example of FIG. 14A, each of the switches $T_1$ 1401/$T_2$ 1403/$T_3$ 1405/$T_4$ 1407/$T_{out}$ 1421 is implemented as a NMOS transistors receiving clocked signals (either Cntrl 1 or Cntrl 2) on their control gate so that the transistors can be fully turned on to cancel their threshold voltages, although in other implementations of Dickson pumps diode connect the switches with their control gates connected to the stage's input voltage. The optimized frequency depends on a number of factors, such as the power bus resistance, charge transfer switch resistance, pump stage capacitance values, the amount of voltage boost, and parasitics, for example.

FIG. 14B illustrates two cycles of a set of waveforms for operating the charge pump circuit 1400 that, in the embodiments of charge pump circuits 370 of FIGS. 3A and 3B can be generated by the control circuitry of the system control logic 360. Looking at the first stage, at $t_0$, CLK 1 is low so the lower plate of $C_1$ 1411 is at ground and Cntrl 2 is low so that $T_2$ 1403 is off, so that when Cntrl 1 then goes high, $V_{in}$ is passed by $T_1$ 1401 to charge the top plate of $C_1$ 1411 to $V_{in}$. Cntrl 1 then goes low to turn off $T_1$ 1401 and traps $V_{in}$ on the top plate of $C_1$ 1411. At $t_1$, CLK 1 then goes high, raising the voltage level on the top plate of $C_1$ 1411 by the amplitude of the CLK 1 signal: for example, if the amplitude of CLK 1 is Vcc, the voltage level on top plate of $C_1$ 1411 becomes $V_{in}$+Vcc. Once Cntrl 2 goes high, $T_2$ passes this voltage on to the top plate of $C_1$ 1411 that, since CLK 2 is low, is set at $V_{in}$+Vcc. Between t2 and t3, the voltage on the upper plate of $C_2$ is then raised by CLK 2 to $V_{in}$+2Vcc and passed on to $C_3$ 1413 and so on, generating an output voltage of $V_{out}$=$V_{in}$+4Vcc, at least as an ideal value and ignoring losses.

The Dickson type charge pump is one of many charge pump circuit designs and the following techniques can be applied more generally to these designs, but the design of FIG. 14A can be used as a reference embodiment. Additionally, to provide a smoother output signal, change pump circuits often run multiple legs of similar design in parallel, but out of phase: for example, the embodiments presented below can use two legs running in parallel, but 180° out of phase, where each "leg" is one block 1400. Charge pumps often also employ regulation to maintain consistent output levels, when a number of techniques can be used, including stopping and starting operation, modulating the input voltage, or modulation the operating frequencies, for instance. The various regulation techniques can be applied to the embodiments discussed below, although these will not be explicitly included in the following discussion.

Figure 15:
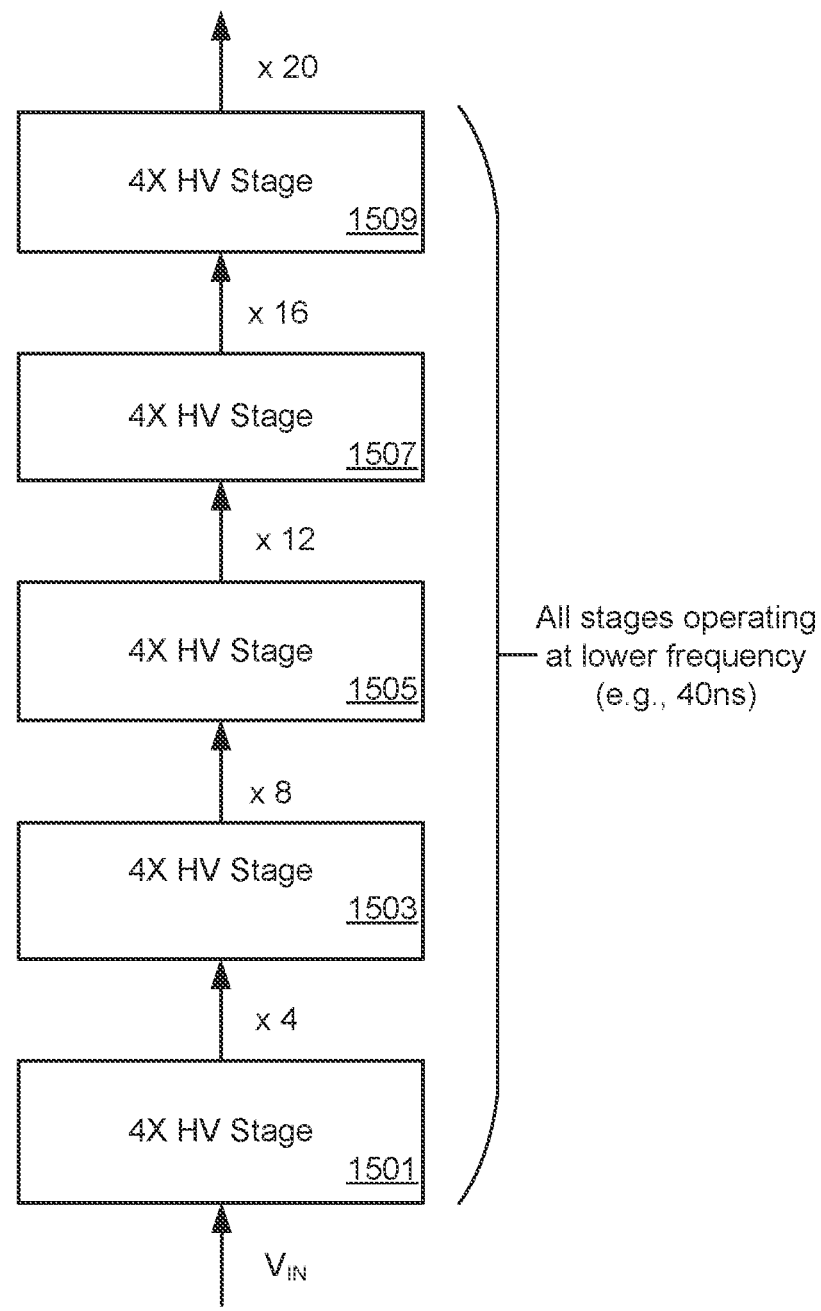
FIG. 15 is a schematic representation of a multi-stage high voltage charge pump made up of multiple 4X charge pump stages.

Returning to the example of generating a program voltage (Vpgm 1303 of FIG. 13) from a supply voltage Vcc, where, in an example implementation, Vcc=~ 3V and Vpgm=25-30V. To generate a voltage increase of this amount requires a large number of charge pump stages. In one implementation, this can be implemented in a modular fashion using multiple cascaded charge pump stages of the type illustrated in FIG. 14A, such as 5 cascaded 4x charge pumps. FIG. 15 is a schematic representation of such a charge pump.

FIG. 15 is a schematic representation of a multi-stage high voltage charge pump made up of multiple 4X charge pump stages. The example of FIG. 15 can be used generate programming voltages and is organized as five cascaded stages of a 4x design as illustrated in FIG. 14A and having two legs operating in parallel 180° out of phase. As the generated voltages can be on the order of 25-30V, high voltage (HV) devices are used for the transistors and capacitors of each stage of the modules 1501, 1503, 1505, 1507, and 1509. To meet targeted voltage and ramp times, the optimized frequency $f_{HV}$ for such high voltage stages may be relatively low for a charge pump, such as corresponding to a period of around 40 ns for example. To improve the strength of the charge pump, a higher operating frequency could be used, but this is not effective due to the parasitics when using HV capacitors and HV transfer switches at such frequencies. Alternately, the HV transfer switches could be replaced with triple well devices that can be optimized to operate at a higher frequency $f_{TWL}$, such as corresponding to a period of around 20 ns for example. However, due to processing related issues such as die thinning, triple well device cannot practically be used for higher voltage levels, such as much over 20V.

To improve upon this situation for higher voltage charge pumps, different stages of the charge pump can be different and individually optimized to help achieve a better output current, such as using triple well transfer switches in the earlier stages and high voltage transfer switches in the later stages, with the switches of each type operating at a frequency optimized for the stage type. For example, the first set of stages of a high voltage charge pump can use triple well transfer switches operating at a period of 20 ns and the latter stages, after a voltage level of ~20V, can use high voltage transfer switches operating at a period of 40 ns. The main example discussed in the following is based on a charge pump for generating a programming voltage Vpgm for a NAND memory with an output voltage level in the 25-30V range, but can more generally applied to other charge pump applications where the higher frequency triple well stages are used to boost the input voltage to an intermediate level, followed by high voltage stages operating at the lower frequency to further boost the intermediate voltage level to the output voltage level.

Figure 16:
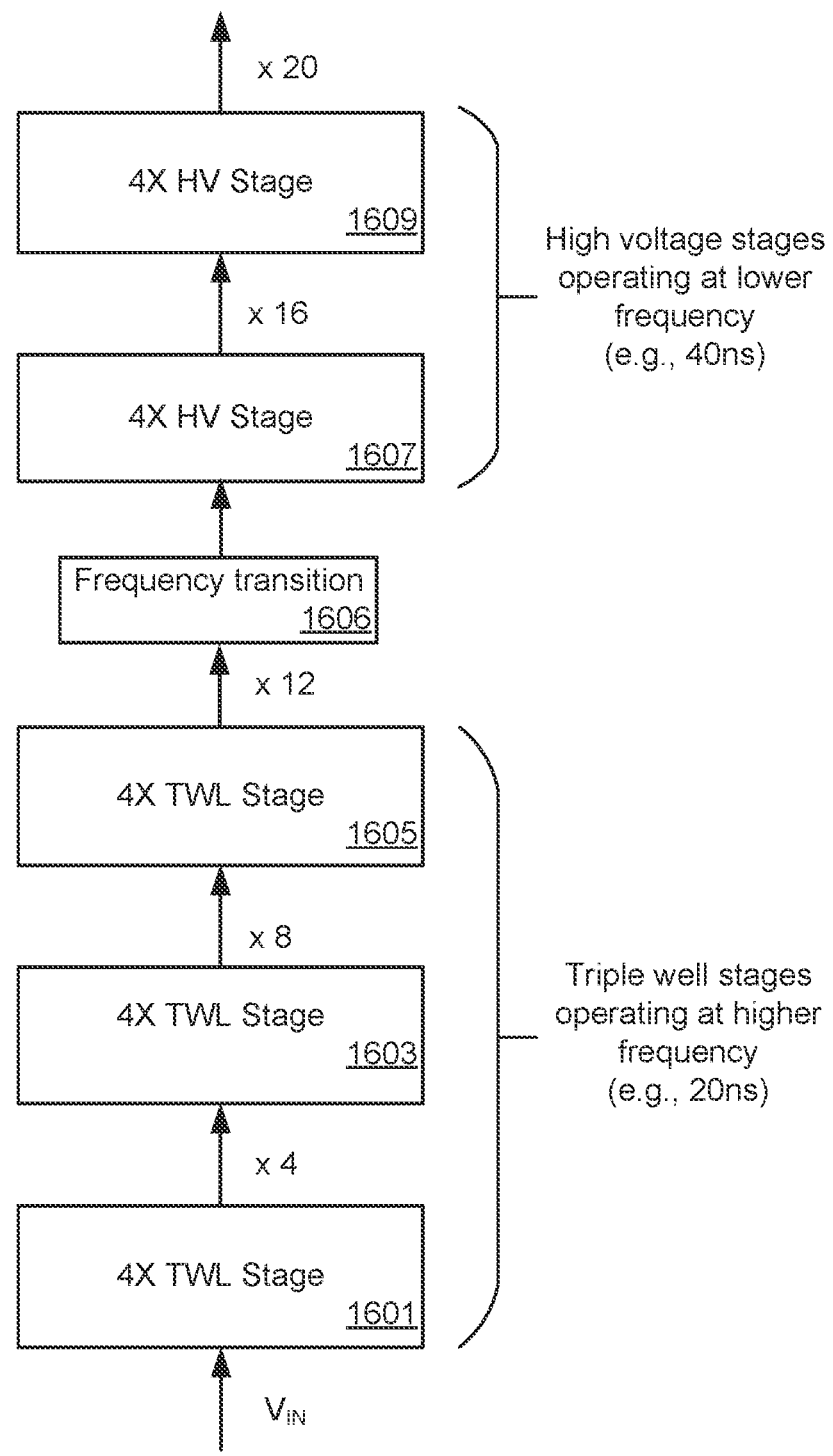
FIG. 16 illustrate an embodiment for a charge pump having a first set of stages using triple well transistors as switches operating at a higher frequency followed by a second set of stages using high voltage transistors operating at a lower frequency.

FIG. 16 illustrate an embodiment for a charge pump having a first set of stages using triple well transistors as switches operating at a higher frequency followed by a second set of stages using high voltage transistors operating at a lower frequency. The example of FIG. 16 is, as with FIG. 15, a high voltage charge pump formed of five 4× charge pump modules, such as could be used to generate a programming voltage. The first three 4× stages, 1601, 1603, and 1605, are triple well stages using triple well transfer switches operating at the triple well switching frequency of $f_{TWL}$, corresponding to a period of 20 ns for example. The last two 4× stages, 1607 and 1609, are high voltage stages using high voltage transfer switches operating at the high voltage switching frequency $f_{HV}$, corresponding to a period of 40 ns for example. The number total stages will depend on the application and its voltage and current requirements, with triple well stages used to generate a voltage level up to design limit value depending on the voltage levels that can be safely supported by the triple well devices, after which high voltage transfer switches are used. This arrangement allows for operating frequency of the triple well section and the operating frequency of the high voltage section to be optimized independently.

The arrangement of FIG. 16 helps to avoid sources of non-optimal usage that can occur when all of the stages are of the same type, whether high voltage stages as in FIG. 15 or all triple well stages. For example, the higher parasitics on stages using high voltage transfer switches can be avoided by using triple well devices in earlier stages; and by using high voltage devices in the later stages, the voltage limitations of triple well devices are avoided. Considering again the Vpgm charge pump example, the triple well transfer switches are used up to about 20V, after which the high voltage devices are used. Consequently, the design can operate both the type of stages at their respective optimal frequency, minimizing the area required for the pump circuit on the die.

Figure 17:
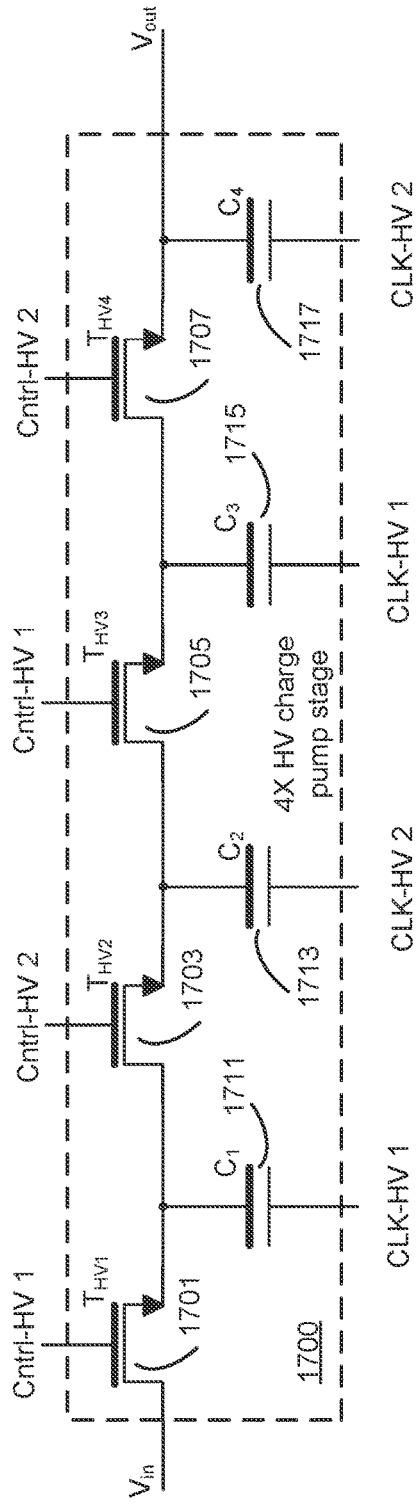
FIGS. 17 and 18A respectively illustrate an embodiment for the high voltage 4X stages and the triple well 4X stages.
Figure 18A:
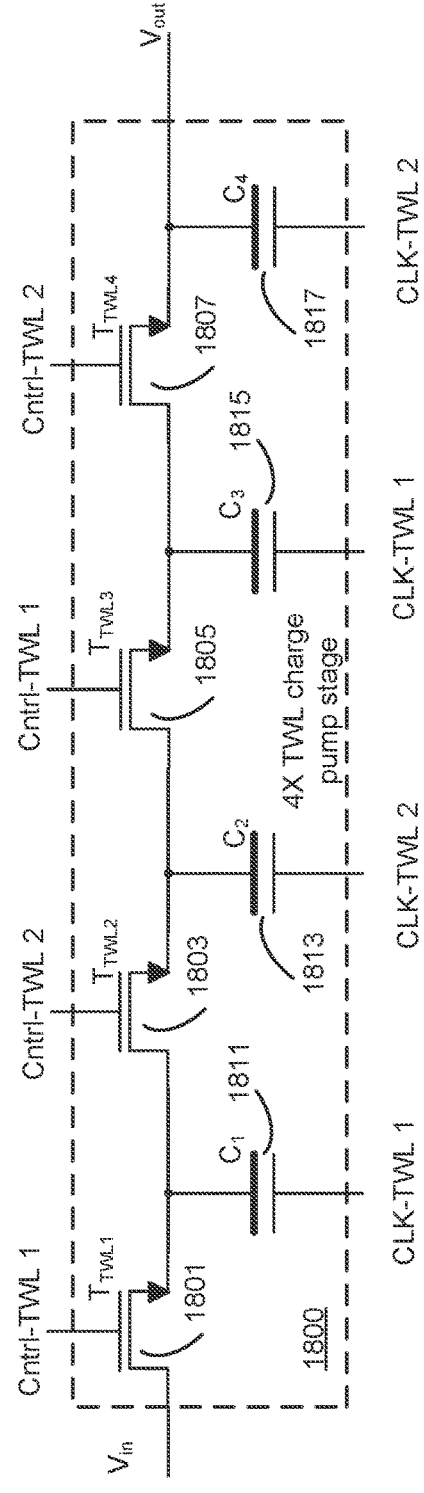

FIGS. 17 and 18A respectively illustrate an embodiment for the high voltage 4X stages and the triple well 4X stages. In this example, Dickson type charge pumps are used, but other charge pump designs can also be used. Additionally, although only a single leg is shown, in the embodiment of FIG. 16 each of block 1601, 1603, 1605 and 1607 and 1609 would have two legs operation in parallel, but at 180° out of phase.

Each leg of the 4X high voltage charge pump stage 1700 is arranged and operates as described above with respect to FIGS. 14A and 14B, except the transfer switches $T_{HV1}$ 1701, $T_{HV2}$ 1703, $T_{HV3}$ 1705, and $T_{HV4}$ 1707 are high voltage devices, as indicated by the heavy line weight of the control gates. Such high voltage transistors can be implemented by, for example, having larger gates, thicker gates, thicker dielectrics, stronger dielectrics, or combinations of these or other techniques. The capacitors $C_1$ 1711, $C_2$ 1713, $C_3$ 1715, and $C_4$ 1717 are also high voltage devices able to support the voltage levels generated by the high voltage stages. The control signals Cntrl-HV 1 and Cntrl-HV 2 and the clock signal CLK-HV 1 and CLK-HV 2 can be as described with respect to FIG. 14B, but now with a frequency of $f_{HV}$.

Each leg of the triple well charge pump stage 1800 is again arranged and operates as described above with respect to FIGS. 14A and 14B, except the transfer switches $T_{TWL1}$ 1801, $T_{TWL2}$ 1803, $T_{TWL3}$ 1805, and $T_{TWL4}$ 1807 are triple well devices. The capacitors $C_1$ 1811, $C_2$ 1813, $C_3$ 1815, and $C_4$ 1817 can again by high voltage devices, but need not be. The control signals Cntrl-TWL 1 and Cntrl-TWL 2 and the clock signal CLK-TWL 1 and CLK-TWL 2 can be as described with respect to FIG. 14B, but now with a frequency of $f_{TWL}$. The triple well structure can be described briefly with respect to FIG. 18B.

Figure 18B:
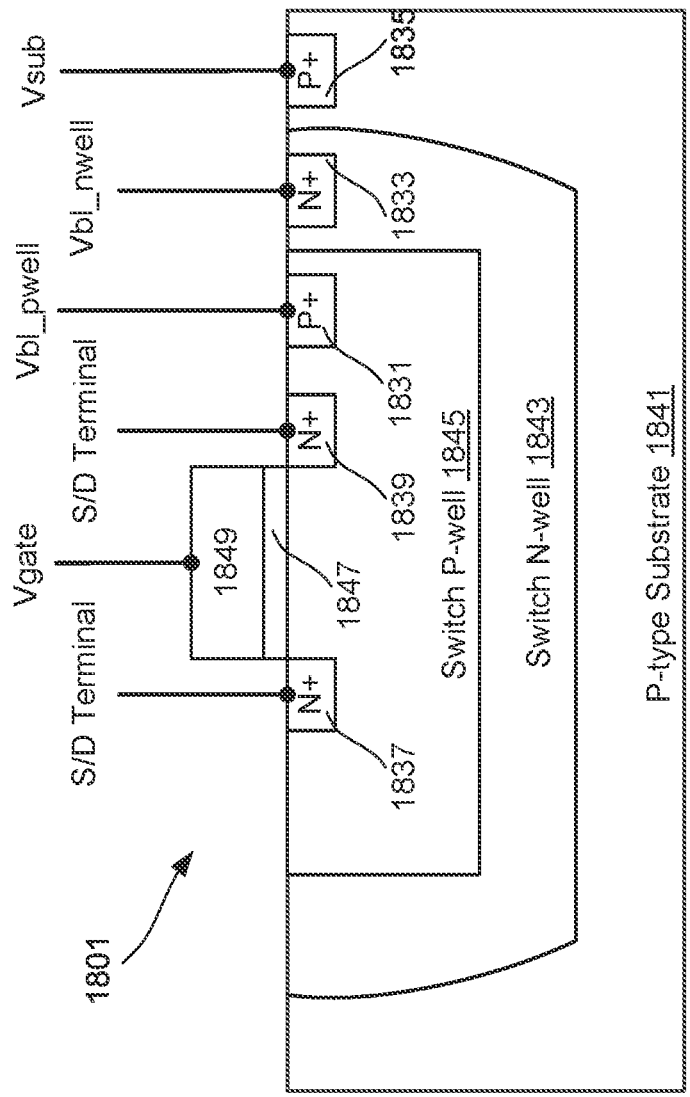
FIG. 18B depicts a triple well transfer switch transistor in accordance with an embodiment.

FIG. 18B depicts a triple well transfer switch transistor 1801 in accordance with an embodiment, where the other triple well transfer switches can be similarly implemented. The transfer switch transistor 1801 is implemented using a substrate 1841 that employs a triple-well. In this example, the switch transistor is formed using a triple-well that includes the p-type substrate 1841, within which is formed a switch n-well 1843, within which is additionally formed a switch p-well 1845. The switch p-well 1845 has a p+ region 1831 in one embodiment which provides an electrical contact for applying the voltage Vbl_pwell to p-well region 1845. The switch n-well region 1843 has an n+ region 1833 in one embodiment which provides an electrical contact for applying the voltage Vbl_nwell to region 1843. The p-type substrate has a p+ region 1835 in one embodiment which provides an electrical contact for applying the voltage Vsub to p-type substrate 1841. The transfer switch transistor 1801 includes two n+ regions 1837 and 1839. One of these n+ regions may form a source and the other may form a drain. These n+ regions may change such that they may be referred to generally as S/D regions.

In the example of transfer switch 1801, S/D region 1837 would be connected to Vin, S/D region 1839 would be connected to the top plate of capacitor $C_1$ 1811 and to transfer switch 1803. The transfer switch transistor 1801 includes a gate 1849 formed over an oxide 1847, although other dielectrics may be used. In the example of transfer switch 1801 of FIG. 18A, the control gate 1849 would be connected to the control signal Cntrl-TWL 1.

Returning to FIG. 16, the triple well stages 1601, 1603, 1605 are operating at one frequency ($f_{TWL}$) and the high voltage stages 1607, 1609 are operating at a different frequency ($f_{HV}$). To connect these two parts together, a frequency transition circuit 1606 is introduced between them.

Figure 19A:
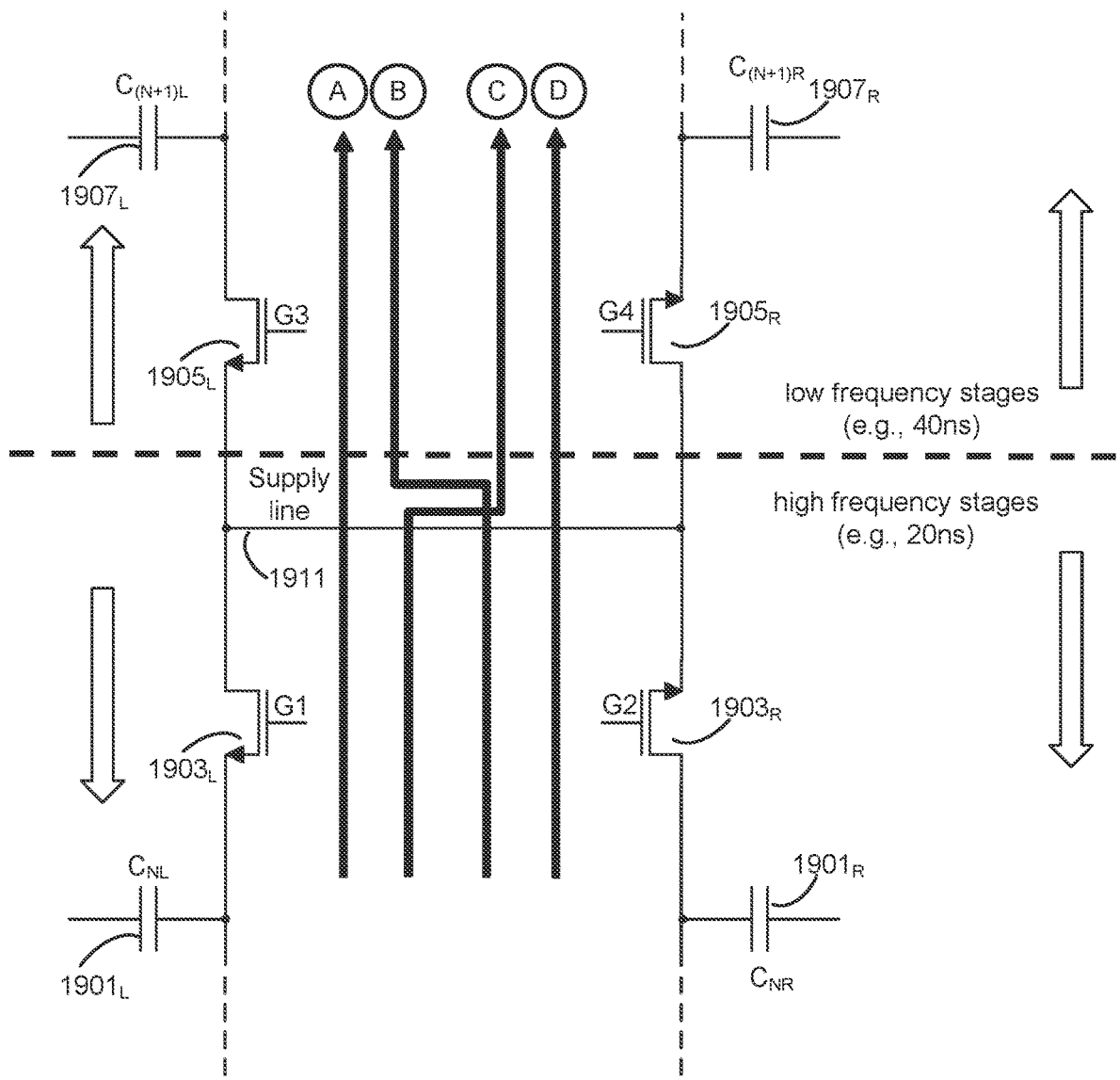
FIGS. 19A and 20A present two embodiments for a frequency transition circuit that have respective control signals represented in FIGS. 19B and 20B.
Figure 19B:
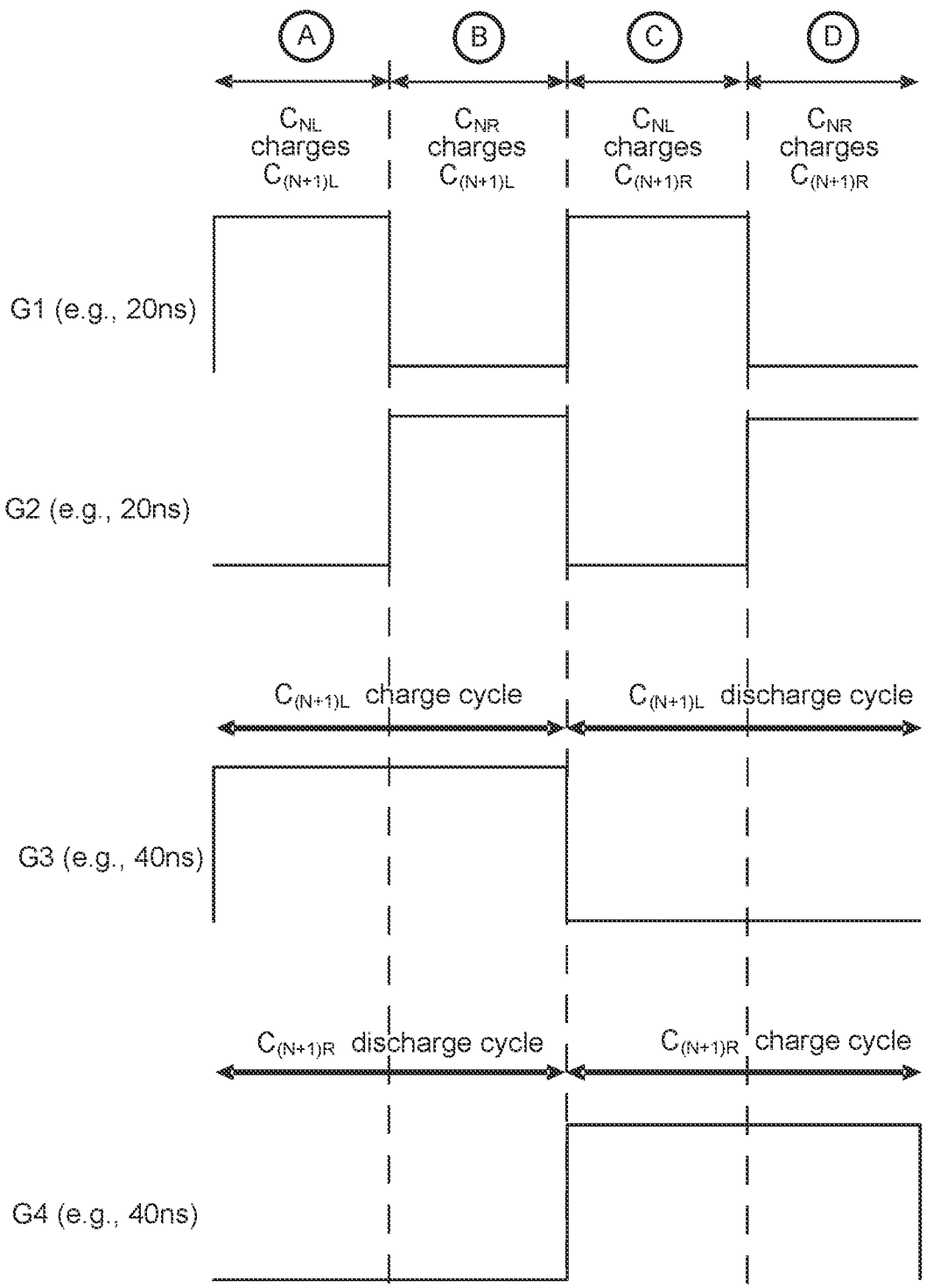
Figure 20A:
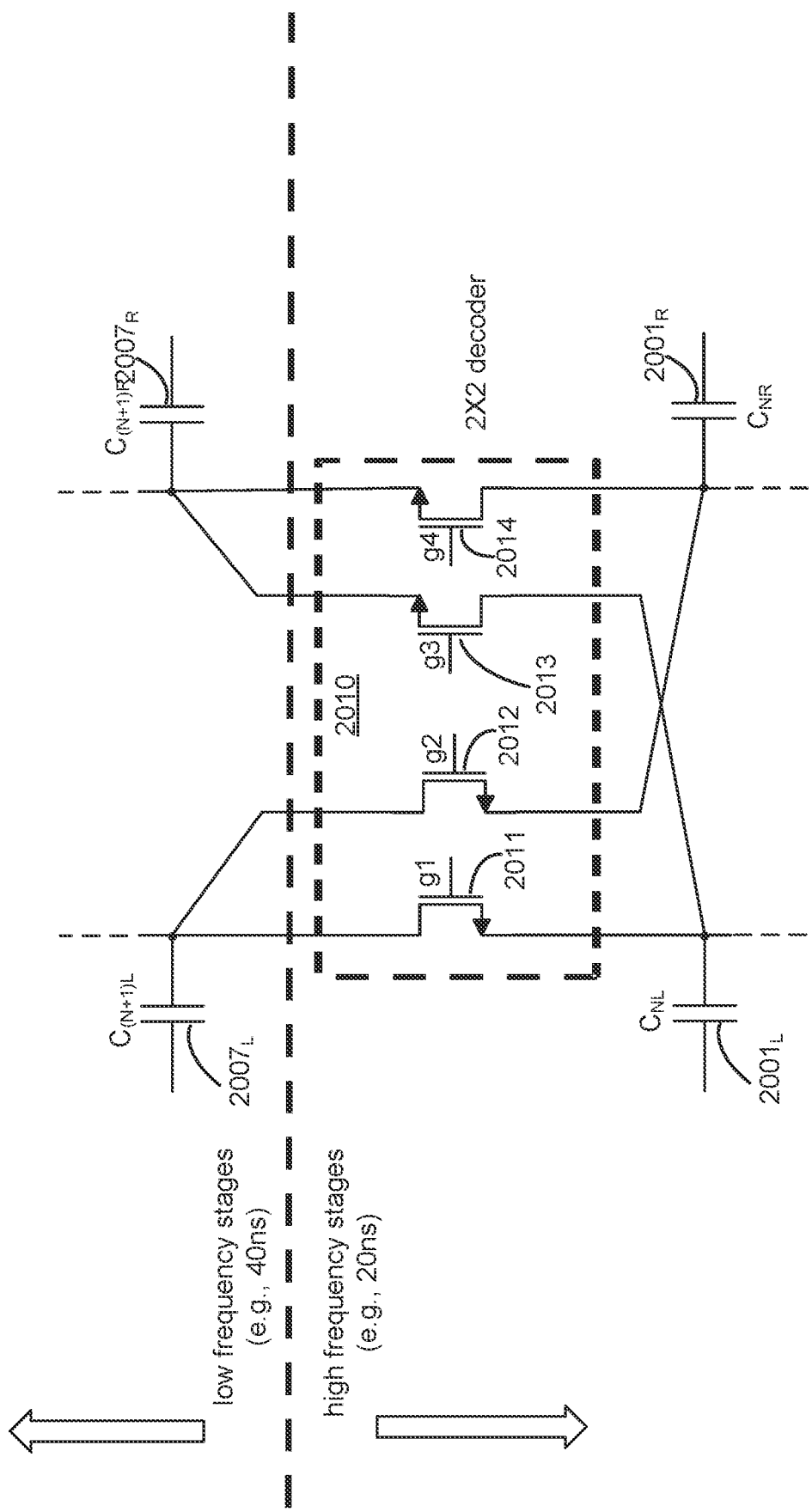
Figure 20B:
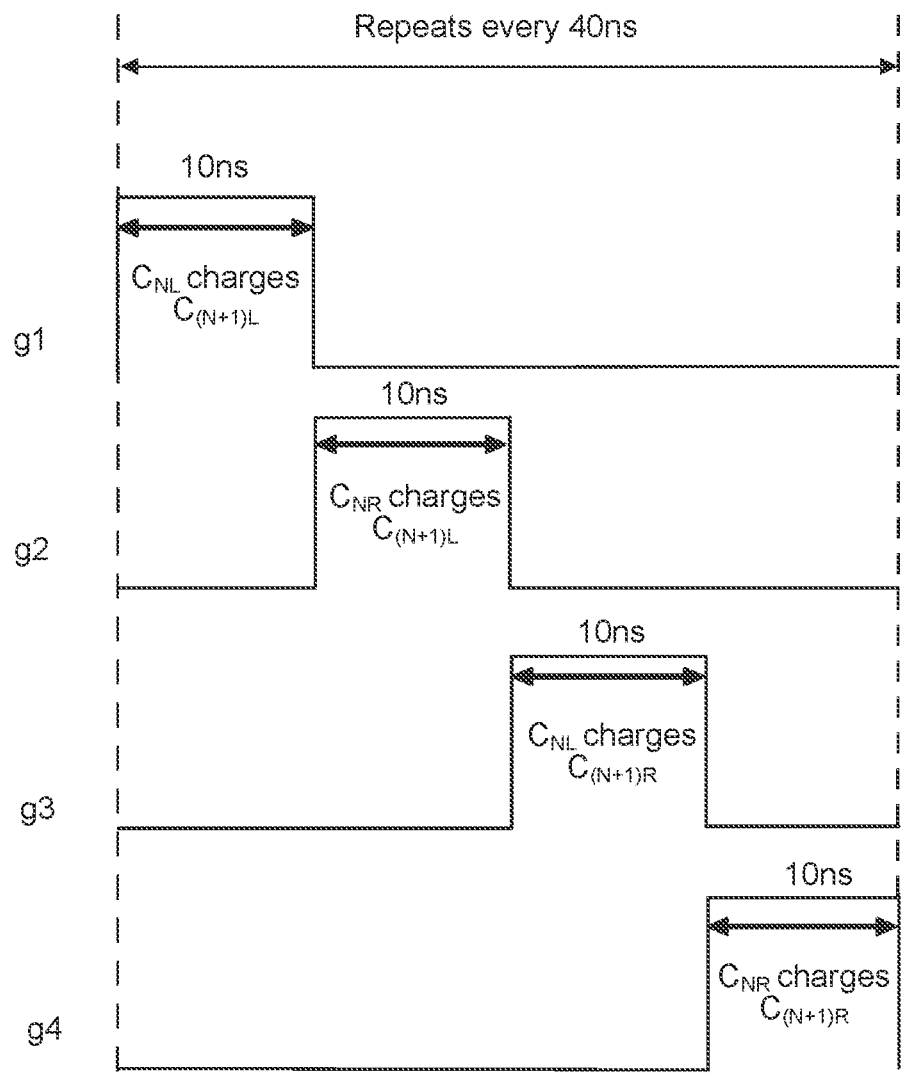

FIGS. 19A and 20A present two embodiments for a frequency transition circuit that have respective control signals represented in FIGS. 19B and 20B. Either of these embodiment can solve the problem of transferring charge from the higher frequency triple well stages to the lower frequency high voltage stages, allowing both phases of the high frequency stage to charge the capacitors of the high voltage stage during each phase of its low frequency operation.

FIG. 19A is a first embodiment for the frequency transition circuit 1606 that forms a supply line at the output of the last high frequency stage, which is then used to supply the first of the low frequency stages. The inputs from the high frequency stages are at the bottom of the figure, with the left leg of the last high frequency stage supplying the upper plate of $C_{NL}$ 1901$_L$ connected at an output node of the left leg of triple well stages and the right leg of the last high frequency stage supplying the upper plate $C_{NR}$ 1901$_R$ connected at an output node of the right leg of triple well stages. The lower plates of $C_{NL}$ 1901$_L$ and $C_{NR}$ 1901$_R$ can be connected to ground, similarly to $C_{out}$ 1423 of FIG. 14A, or they can be switched as the last stage's capacitor of the high frequency stages. Switches G1 1903$_L$ and G2 1903$_L$ respectively connect the upper plates of $C_{NL}$ 1901$_L$ and $C_{NR}$ 1901$_R$ to the supply line 1911 connected between the two legs of the pump circuit. The transfer switches G1 1903$_L$ and G2 1903$_L$ can be triple well devices like the other high frequency stages, or, in alternate embodiments, standard NMOS devices depending on design choices.

The supply line 1911 connecting the left and right legs is connected through respective switches G3 1905$_L$ and G4 1905$_R$ to the left and right legs of the high voltage stages of the charge pump, initially connecting, respectively, to capacitors $C_{(N+1)L}$ 1907$_L$ connected at an input node of the left leg of high voltage stages and $C_{(N+1)R}$ 1907$_R$ connected at an input node of the right leg of high voltage stages, and then onward to the high voltage pump stages. The switches G3 1905$_L$ and G4 1905$_R$ are operating at the lower frequency and can be high voltage devices or, in alternate embodiments, standard NMOS devices or even triple well devices, depending on layout practicalities. The four heavy line weight arrow represent the four charge transfer paths of: (A) left to left; (B) right to left; (C) left to right; and (D) left to left. FIG. 19B is an embodiment of the control signals to generate the different transfers.

The waveforms of FIG. 19B are an embodiment for the control signal of the frequency transition circuit of FIG. 19A and, in the embodiments of charge pump circuits 370 of FIGS. 3A and 3B, can be generated by the control circuitry of the system control logic 360. In FIG. 19B, as well as other examples here, the high and low frequency portions have frequencies in the ratio of 2:1, but other integer and non-integer values can be used. The top two waveforms are respectively for the high frequency switches G1 1903$_L$ and G2 1903$_R$ that are 180° out of phase at the high frequency $f_{TWL}$ corresponding to a period of 20 ns for example. The lower two waveforms are respectively for the lower frequency switches G3 1905$_L$ and G4 1905$_R$ that are 180° out of phase at the lower frequency $f_{HV}$, corresponding to a period of 40 ns for example. When G3 is high $C_{(N+1)L}$ 1907$_L$ is on its charge cycle and when G3 is low $C_{(N+1)L}$ 1907$_L$ is on its discharge cycle. Similarly, when G4 is low $C_{(N+1)R}$ 1907$_R$ is on its discharge cycle and when G4 is high $C_{(N+1)R}$ 1907$_R$ is on its charge cycle. Looking at the G1 and G2 waveforms, during period (A) G1 is high and G2 is low, so that $C_{NL}$. 1901$_L$ charges $C_{(N+1)L}$ 1907$_L$; and during period (B) G1 is low and G2 is high, so that $C_{NR}$ 1901$_R$ charges $C_{(N+1)L}$ 1907$_L$. Similarly, during period (C) G1 is high and G2 is low, so that $C_{NL}$ 1901$_L$ charges $C_{(N+1)R}$ 1907$_R$; and during period (D) G1 is low and G2 is high, so that $C_{NR}$ 1901$_R$ charges $C_{(N+1)R}$ 1907$_R$.

FIG. 20A is another embodiment for the frequency transition circuit 1606 using a 2×2 decoder 2010 where both phases of high frequency stage are used to alternately charge the phases of low frequency stages. The inputs from the high frequency stages are at the bottom of the figure, with the left leg of the last high frequency stage supplying the upper plate of $C_{NL}$ 2001$_L$ connected at an output node of the left leg of triple well stages and the right leg of the last high frequency stage supplying the upper plate $C_{NR}$ 2001$_R$ connected at an output node of the right leg of triple well stages. The lower plates of $C_{NL}$ 2001$_L$ and $C_{NR}$ 2001$_R$ can be connected to ground, similarly to $C_{out}$ 1423 of FIG. 14A, or they can be switched as the last stage's capacitor of the high frequency stages. Switches g1 2011 and g2 2012 of decoder 2010 respectively connect the upper plates of $C_{NL}$ 2001$_L$ at an input node of the left leg of high voltage stages and $C_{NR}$ 2001$_R$ to $C_{(N+1)L}$ 2007$_L$ $C_{(N+1)L}$ 1907$_L$ at an input node of the left leg of high voltage stages and $C_{(N+1)R}$ 1907$_R$ connected at an input node of the right leg of high voltage stages, of the left leg of the high voltage, low frequency stages. Switches g3 2013 and g4 2014 of decoder 2010 respectively connect the upper plates of $C_{NL}$ 2001$_L$ and $C_{NR}$ 2001$_R$ to $C_{(N+1)R}$ 2007$_R$ of the right leg of the high voltage, low frequency stages.

The waveforms of FIG. 20B are an embodiment for the control signal of the frequency transition circuit of FIG. 20A and, in the embodiments of charge pump circuits 370 of FIGS. 3A and 3B, can be generated by the control circuitry of the system control logic 360. The waveforms for the control signals of g1, g2, g3, and g4 sequentially go high with a duty cycle of ¼, where, for the example of the high frequency stages having a period of 20 ns and the high voltage stages have a period of 40 ns, each control signal is high for 10 ns. As these signals cycle: when g1 is high, $C_{NL}$ 2001$_L$ charges C(N+D)L. 2007$_L$; when g2 is high, $C_{NR}$ 2001$_R$ charges $C_{(N+1)L}$ 2007$_L$; when g3 is high, $C_{NL}$ 2001$_L$ charges $C_{(N+1)R}$ 2007$_R$; and when g4 is high, $C_{NR}$ 1901$_R$ charges $C_{(N+1)R}$ 2007$_R$. Thus, the signals are thereby converted from the higher frequency operation on initial stages to the lower frequency operation of later stages.

Although the embodiments presented above with respect to FIGS. 16-20A include a frequency transition circuit 1606, the ability to optimize frequency of each of the stages can still provide an area savings on the memory or control die, such as an area savings of around one quarter (¼) of the area occupied by the embodiment of FIG. 15. Although described with respect to a particular pump architecture based on Dickson pumps with two legs, the same approach can be extended to other pump architectures, although the differences in parasitics, increase in output levels, process limitations, and other factors will need to be taken into account. These difference can lead to a different division of the number stages that use the triple well devices and the high voltage devices, as well as the frequency used for each set of stages. Also, the example periods used above as corresponding to the frequencies $F_{TWL}$ and $f_{HV}$ are just illustrative and actual values for the frequencies, as well as number of each type of stage, will vary based on the implementation.

Figure 21:
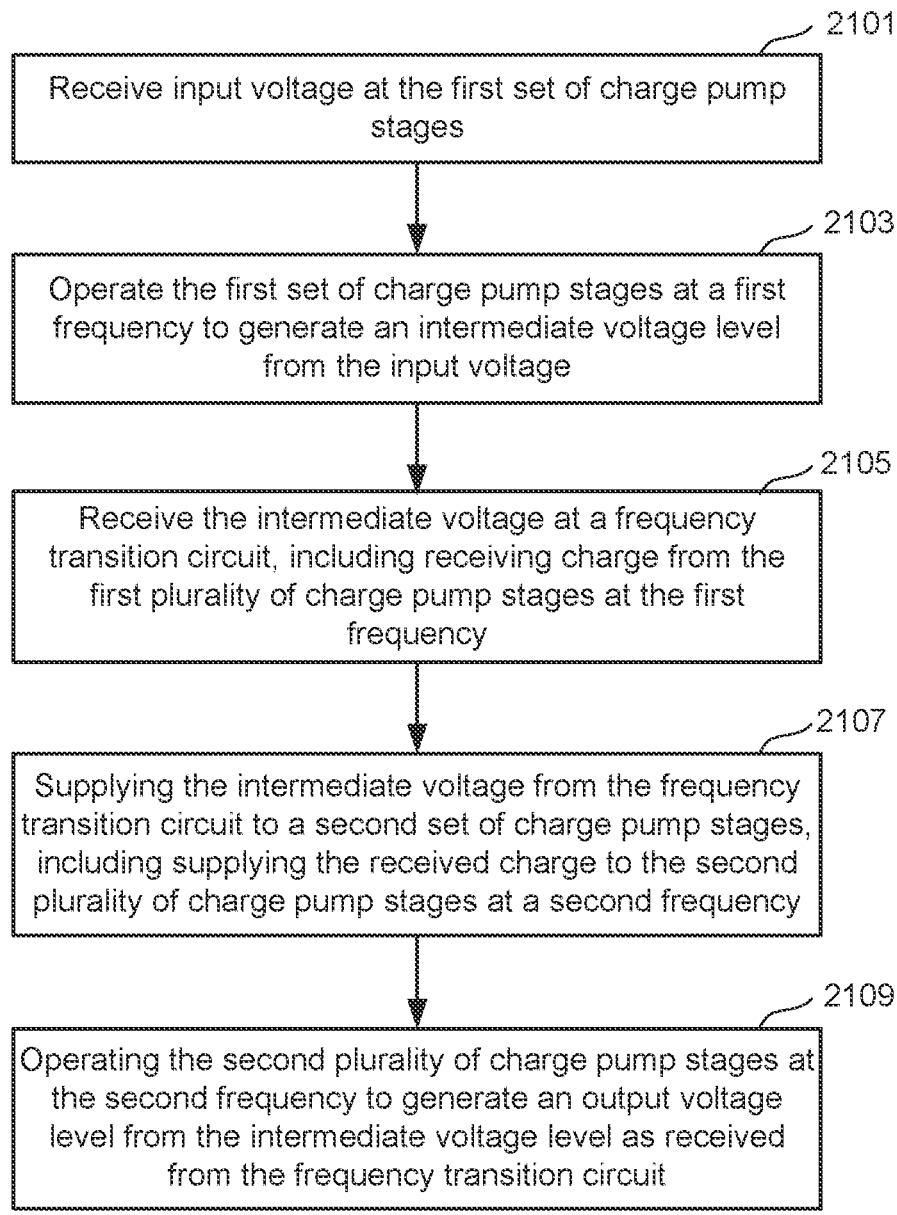
FIG. 21 is a flowchart of an embodiment for the operation of the charge pumps described with respect to FIGS. 16-20A.

FIG. 21 is a flowchart of an embodiment for the operation of the charge pumps described with respect to FIGS. 16-20A. Staring at step 2101, an input voltage is received at the set of first stages of the charge pump circuit. For example, referring to FIG. 16, the input voltage is Vin received at the first of the 4X triple well stages 1601. This input voltage can be the on-die supply level Vcc or other voltage level, such as a regulated input voltage derived from Vcc. At step 2103, the first set of charge pump stages, the triple well stages 1800 of FIG. 18A in the example embodiments, operate at a first frequency to generate an intermediate voltage (i.e., the output of 4× triple stage 1605) from the input voltage. This intermediate voltage is then received at the frequency transition circuit 1606 at step 2105, where this includes receiving charge from the first set of charge pump stages at the first frequency, as described with respect to FIGS. 19A and 19B or with respect to FIGS. 20A and 20B for the two example embodiments.

At step 2107 the intermediate voltage generated by the first set of stages (the triple well stages operating at the higher frequency in the examples) is supplied from the frequency transition circuit 1606 to the second set of charge pump stages, including supplying the received charge of step 2105, to the second set of charge pump stages. In the embodiments of FIGS. 16-20B, the set of charge pump stages are high voltage stages operating at the lower frequency, at which the received charge is provided to the second set of stages. The second set of charge pumps (e.g., the high voltage stages) are operated at the second frequency to generate the output voltage from the intermediate voltage received from the frequency transition circuit at step 2109. For example, the output voltage can be a programming voltage.

One embodiment includes a non-volatile memory device comprising a control circuit configured to connect to an array of non-volatile memory cells. The control circuit comprising a charge pump circuit includes: a first plurality of charge pump stages configured to receive a supply voltage level and to generate an intermediate voltage level from the supply voltage level; a second plurality of charge pump stages configured to receive the intermediate voltage level and to generate an output voltage level from the intermediate voltage level; and a frequency transition circuit connected to receive the intermediate voltage from the first plurality of charge pump stages and supply the intermediate voltage to the second plurality of charge pump stages and configured to receive charge from the first plurality of charge pump stages and to supply the received charge to the second plurality of charge pump stages. The control circuit configured to: operate the first plurality of charge pump stages at a first frequency to generate an intermediate voltage level; operate the second plurality of charge pump stages at a second frequency to generate an output voltage level; operate the frequency transition circuit to receive charge from the first plurality of charge pump stages at the first frequency and supply the received charge to the second plurality of charge pump stages at the second frequency; and apply the generated output voltage level to one or more of the memory cells of the array.

One embodiment includes a method comprising: receiving, at a first plurality of charge pump stages, an input voltage; operating the first plurality of charge pump stages at a first frequency to generate an intermediate voltage level from an input voltage level; receiving the intermediate voltage at a frequency transition circuit, including receiving charge from the first plurality of charge pump stages at the first frequency; supplying the intermediate voltage from the frequency transition circuit to a second plurality of charge pump stages, including supplying the received charge to the second plurality of charge pump stages at a second frequency; and operating the second plurality of charge pump stages at the second frequency to generate an output voltage level from the intermediate voltage level as received from the frequency transition circuit.

One embodiment includes a charge pump system, comprising: a first plurality of charge pump stages configured to operate at a first frequency to generate an intermediate voltage level from an input voltage level; a second plurality of charge pump stages configured to operate at a second frequency to generate an output voltage level from the intermediate voltage level; and a frequency transition circuit connected to receive the intermediate voltage from the first plurality of charge pump stages and supply the intermediate voltage to the second plurality of charge pump stages and configured to receive charge from the first plurality of charge pump stages at the first frequency and supply the received charge to the second plurality of charge pump stages at the second frequency.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:
1. A non-volatile memory device, comprising:
 a control circuit configured to connect to an array of non-volatile memory cells, the control circuit comprising a charge pump circuit including:
  a first plurality of charge pump stages configured to receive a supply voltage level and to generate an intermediate voltage level from the supply voltage level;
  a second plurality of charge pump stages configured to receive the intermediate voltage level and to generate an output voltage level from the intermediate voltage level; and
  a frequency transition circuit connected to receive the intermediate voltage from the first plurality of charge pump stages and supply the intermediate voltage to the second plurality of charge pump stages and configured to receive charge from the first plurality of charge pump stages and to supply the received charge to the second plurality of charge pump stages, the control circuit configured to:
- operate the first plurality of charge pump stages at a first frequency to generate the intermediate voltage level;
- operate the second plurality of charge pump stages at a second frequency to generate the output voltage level;
- operate the frequency transition circuit to receive charge from the first plurality of charge pump stages at the first frequency and supply the received charge to the second plurality of charge pump stages at the second frequency; and
- apply the generated output voltage level to one or more of the memory cells of the array.

2. The non-volatile memory device of claim 1, wherein the control circuit is on a control die, the non-volatile memory device further comprising:
- a memory die including the array of non-volatile memory cells, the memory die separate from and bonded to the control die.

3. The non-volatile memory device of claim 1, wherein:
- each stage of the first plurality of charge pump stages includes a transfer switch transistor having a triple well structure;
- each stage of the second plurality of charge pump stages includes a transfer switch transistor having a high voltage structure; and
- the first frequency is higher than the second frequency.

4. The non-volatile memory device of claim 1, wherein the stages of the first plurality of charge pump stages are of a Dickson type and the stages of the second plurality of charge pump stages are of the Dickson type.

5. The non-volatile memory device of claim 1, wherein each of the first and second pluralities of charge pump stages include a first leg and a second leg operating in parallel, and wherein the frequency transition circuit comprises:
- a first capacitor connected at an output node of the first leg of the first plurality of charge pump stages;
- a second capacitor connected at an input node of the first leg of the second plurality of charge pump stages;
- a third capacitor connected at an output node of the second leg of the first plurality of charge pump stages;
- a fourth capacitor connected at an input node of the second leg of the second plurality of charge pump stages; and
- a plurality of switches connecting the output nodes of the first and second legs of the first plurality of charge pump stages to the input nodes first and second legs of the second plurality of charge pump stages.

6. The non-volatile memory device of claim 5, wherein the plurality of switches connecting the output nodes of the first and second legs of the first plurality of charge pump stages to the first and second legs of the second plurality of charge pump stages comprise:
- first and second switches connected in series between the output node of the first leg of the first plurality of charge pump stages and the input node of the first leg of the second plurality of charge pump stages; and
- third and fourth switches connected in series between the output node of the second leg of the first plurality of charge pump stages and the input node of the second leg of the second plurality of charge pump stages, and wherein the frequency transition circuit further comprises:
- a supply line connected between a node between the first and second switches connected in series and a node between the third and fourth switches connected in series.

7. The non-volatile memory device of claim 5, wherein plurality of switches connecting the output nodes of the first and second legs of the first plurality of charge pump stages to the first and second legs of the second plurality of charge pump stages comprise:
- a first switch connected between the output node of the first leg of the first plurality of charge pump stages and the input node of the first leg of the second plurality of charge pump stages;
- a second switch connected between the output node of the second leg of the first plurality of charge pump stages and the input node of the first leg of the second plurality of charge pump stages;
- a third switch connected between the output node of the first leg of the first plurality of charge pump stages and the input node of the second leg of the second plurality of charge pump stages; and
- a fourth switch connected between the output node of the second leg of the first plurality of charge pump stages and the input node of the second leg of the second plurality of charge pump stages.

8. The non-volatile memory device of claim 1, where the control circuit is configured to apply the generated output voltage level to one or more of the memory cells as part of a programming operation.

9. The non-volatile memory device of claim 1, where the control circuit is configured to apply the generated output voltage level to one or more of the memory cells as part of a read operation.

10. The non-volatile memory device of claim 1, where the control circuit is configured to apply the generated output voltage level to one or more of the memory cells as part of an erase operation.

11. A method, comprising:
- receiving, at a first plurality of charge pump stages, an input voltage level;
- operating the first plurality of charge pump stages at a first frequency to generate an intermediate voltage level from the input voltage level;
- receiving the intermediate voltage at a frequency transition circuit, including receiving charge from the first plurality of charge pump stages at the first frequency;
- supplying the intermediate voltage from the frequency transition circuit to a second plurality of charge pump stages, including supplying the received charge to the second plurality of charge pump stages at a second frequency; and
- operating the second plurality of charge pump stages at the second frequency to generate an output voltage level from the intermediate voltage level as received from the frequency transition circuit.

12. The method of claim 11, wherein each stage of the first plurality of charge pump stages includes a transfer switch transistor having a triple well structure, each stage of the second plurality of charge pump stages includes a transfer switch transistor having a high voltage structure, and the first frequency is higher than the second frequency.

13. The method of claim 11, wherein each of the first and second pluralities of charge pump stages include a first leg and a second leg operating in parallel, the method further comprising:

storing charge from the first leg of the first plurality of charge pump stages on a first capacitor connected at an output node of the first leg of the first plurality of charge pump stages;

storing charge received at the first leg of the second plurality of charge pump stages on a second capacitor connected at an input node of the first leg of the second plurality of charge pump stages;

storing charge from the second leg of the first plurality of charge pump stages on a third capacitor connected at an output node of the second leg of the first plurality of charge pump stages;

storing charge received at the second leg of the second plurality of charge pump stages on a fourth capacitor connected at an input node of the second leg of the second plurality of charge pump stages;

transferring charge from the first capacitor to a supply line connected between a first node and a second node though a first switch, the first node between the output node of the first leg of the first plurality of charge pump stages and the input node of the first leg of the second plurality of charge pump stages and the second node between the output node of the second leg of the first plurality of charge pump stages and the input node of the second leg of the second plurality of charge pump stages;

transferring charge to the second capacitor from the supply line though a second switch;

transferring charge from the third capacitor to the supply line though a third switch; and transferring charge to the fourth capacitor from the supply line though a fourth switch.

14. The method of claim 11, wherein each of the first and second pluralities of charge pump stages include a first leg and a second leg operating in parallel, the method further comprising:

storing charge from the first leg of the first plurality of charge pump stages on a first capacitor connected at an output node of the first leg of the first plurality of charge pump stages;

storing charge received at the first leg of the second plurality of charge pump stages on a second capacitor connected at an input node of the first leg of the second plurality of charge pump stages;

storing charge from the second leg of the first plurality of charge pump stages on a third capacitor connected at an output node of the second leg of the first plurality of charge pump stages;

storing charge received at the second leg of the second plurality of charge pump stages on a fourth capacitor connected at an input node of the second leg of the second plurality of charge pump stages;

supplying charge from the output node of the first leg of the first plurality of charge pump stages to the input node of the first leg of the second plurality of charge pump stages through a first switch;

supplying charge from the output node of the second leg of the first plurality of charge pump stages to the input node of the first leg of the second plurality of charge pump stages through a second switch;

supplying charge from the output node of the first leg of the first plurality of charge pump stages to the input node of the second leg of the second plurality of charge pump stages through a third switch; and supplying charge from the output node of the second leg of the first plurality of charge pump stages to the input node of the second leg of the second plurality of charge pump stages through a fourth switch.

15. A charge pump system, comprising:
a first plurality of charge pump stages configured to operate at a first frequency to generate an intermediate voltage level from an input voltage level;
a second plurality of charge pump stages configured to operate at a second frequency to generate an output voltage level from the intermediate voltage level; and
a frequency transition circuit connected to receive the intermediate voltage from the first plurality of charge pump stages and supply the intermediate voltage to the second plurality of charge pump stages and configured to receive charge from the first plurality of charge pump stages at the first frequency and supply the received charge to the second plurality of charge pump stages at the second frequency.

16. The charge pump system of claim 15, wherein:
each stage of the first plurality of charge pump stages includes a transfer switch transistor having a triple well structure; and
each stage of the second plurality of charge pump stages includes a transfer switch transistor having a high voltage structure, and
the first frequency is higher than the second frequency.

17. The charge pump system of claim 15, wherein the stages of the first plurality of charge pump stages are of a Dickson type and the stages of the second plurality of charge pump stages are of the Dickson type.

18. The charge pump system of claim 15, wherein each of the first and second pluralities of charge pump stages include a first leg and a second leg operating in parallel, and wherein the frequency transition circuit comprises:
a first capacitor connected at an output node of the first leg of the first plurality of charge pump stages;
a second capacitor connected at an input node of the first leg of the second plurality of charge pump stages;
a third capacitor connected at an output node of the second leg of the first plurality of charge pump stages;
a fourth capacitor connected at an input node of the second leg of the second plurality of charge pump stages; and
a plurality of switches connecting the output nodes of the first and second legs of the first plurality of charge pump stages to the input nodes first and second legs of the second plurality of charge pump stages.

19. The charge pump system of claim 18, wherein the plurality of switches connecting the output nodes of the first and second legs of the first plurality of charge pump stages to the first and second legs of the second plurality of charge pump stages comprise:
first and second switches connected in series between the output node of the first leg of the first plurality of charge pump stages and the input node of the first leg of the second plurality of charge pump stages;
third and fourth switches connected in series between the output node of the second leg of the first plurality of charge pump stages and the input node of the second leg of the second plurality of charge pump stages, and
wherein the frequency transition circuit further comprises:
a supply line connected between a node between the first and second switches connected in series and a node between the third and fourth switches connected in series.

20. The charge pump system of claim 18, wherein plurality of switches connecting the output nodes of the first and second legs of the first plurality of charge pump stages to the first and second legs of the second plurality of charge pump stages comprise:
- a first switch connected between the output node of the first leg of the first plurality of charge pump stages and the input node of the first leg of the second plurality of charge pump stages;
- a second switch connected between the output node of the second leg of the first plurality of charge pump stages and the input node of the first leg of the second plurality of charge pump stages; and
- a third switch connected between the output node of the first leg of the first plurality of charge pump stages and the input node of the second leg of the second plurality of charge pump stages; and
- a fourth switch connected between the output node of the second leg of the first plurality of charge pump stages and the input node of the second leg of the second plurality of charge pump stages.

* * * * *